US012797288B2

(12) United States Patent
Xia et al.

(10) Patent No.: US 12,797,288 B2
(45) Date of Patent: Nov. 17, 2026

(54) MULTI-HANDLE FASCIA GUN

(71) Applicant: SICHUAN QIANLI-BEOKA MEDICAL TECHNOLOGY INC., Chengdu (CN)

(72) Inventors: Liangfei Xia, Chengdu (CN); Wen Zhang, Chengdu (CN)

(73) Assignee: SICHUAN QIANLI-BEOKA MEDICAL TECHNOLOGY INC., Chengdu (CN)

( * ) Notice: Subject to any disclaimer, the term of this patent is extended or adjusted under 35 U.S.C. 154(b) by 761 days.

(21) Appl. No.: 18/197,668

(22) Filed: May 15, 2023

(65) Prior Publication Data

US 2023/0390148 A1 Dec. 7, 2023

(30) Foreign Application Priority Data

Jun. 2, 2022 (CN) ......................... 202221378462.3
Jun. 2, 2022 (CN) ......................... 202221380125.8

(51) Int. Cl.

*A61H 23/02* (2006.01)
*A61H 23/00* (2006.01)
*H05K 5/02* (2006.01)
*H05K 7/20* (2006.01)

(52) U.S. Cl.

CPC ........... *A61H 23/02* (2013.01); *H05K 5/0247* (2013.01); *H05K 7/20* (2013.01); *A61H 23/006* (2013.01); *A61H 23/0254* (2013.01)

(58) Field of Classification Search

CPC .................. A61H 23/00; A61H 23/006; A61H 23/0254; A61H 23/06; A61H 2201/0153; A61H 2201/0157; A61H 2201/149; B25G 3/00; B25G 3/02; B25G 3/12; B25G 3/35;

(Continued)

(56) References Cited

U.S. PATENT DOCUMENTS 7,779,931 B2 * 8/2010 Townsan ............. B25B 23/0028 173/217
10,034,813 B1 * 7/2018 Silver ..................... A61H 7/001
10,427,270 B2 * 10/2019 Johnson .................. B24B 23/06

(Continued)

*Primary Examiner* — Douglas Y Sul
(74) *Attorney, Agent, or Firm* — Caesar Rivise, PC

(57) ABSTRACT

The invention belongs to the field of massage equipment, and specifically discloses a multi-handle fascia gun with better massage effect. In the multi-handle fascia gun, the fascia gun body includes a fascia gun housing, and the fascia gun housing further includes a first handle, a third handle, a second handle, and a control handle connected in sequence; the axes of the first handle, the third handle, the second handle, and the control handle enclose a parallelogram. A handle with parallelogram structure has multiple holding parts, so users can choose different holding handles according to different massage parts and needs, and also choose an appropriate handle according to the rotation angle of a steering head, so as to ensure that an axis of impact force is perpendicular to the holding direction as much as possible, thus reducing lateral counter-acting force, avoiding loosening of holding, and improving comfort of holding. Especially, when two hands hold two opposite handles in a parallelogram for massage, reverse impact force will be evenly distributed on the two handles, which is more convenient for cooperation between the two hands.

25 Claims, 14 Drawing Sheets

(58) Field of Classification Search
CPC .......... B25G 3/38; B23D 51/08; B23D 51/10; B23D 51/16
See application file for complete search history.

(56) References Cited

U.S. PATENT DOCUMENTS

| | | | | | |
|---|---|---|---|---|---|
| D967,971 | S | * | 10/2022 | Jinfeng | D24/215 |
| 2003/0095842 | A1 | * | 5/2003 | Bone | B25F 5/02<br>408/234 |
| 2016/0367425 | A1 | * | 12/2016 | Wersland | A61H 1/008 |
| 2018/0200141 | A1 | * | 7/2018 | Wersland | A61H 23/0254 |
| 2019/0175434 | A1 | * | 6/2019 | Zhang | A61H 15/0085 |
| 2019/0254922 | A1 | * | 8/2019 | Marton | A61H 23/006 |
| 2020/0261307 | A1 | | 8/2020 | Wersland et al. | |
| 2020/0268594 | A1 | * | 8/2020 | Pepe | A61H 15/0085 |
| 2021/0059898 | A1 | * | 3/2021 | Wersland | A61H 23/0263 |
| 2021/0128402 | A1 | * | 5/2021 | Dai | A61H 23/0263 |
| 2022/0362097 | A1 | * | 11/2022 | Hart | A61H 23/0254 |

* cited by examiner

MULTI-HANDLE FASCIA GUN

CROSS-REFERENCE TO RELATED APPLICATIONS

This application claims the benefit under 35 U.S.C. § 119(a) to Chinese Patent Application No. 202221378462.3 and Chinese Patent Application No. 202221380125.8, both filed on Jun. 2, 2022, which are incorporated herein by reference in their entireties.

FIELD OF THE INVENTION

The invention belongs to the field of massage equipment, and specifically relates to a multi-handle fascia gun.

BACKGROUND OF THE RELATED ART

Fascia gun, also known as deep muscle stimulator, is a soft tissue massage tool, which relaxes the soft tissue of the body through high-frequency impact. The existing fascia gun drives the massage head to do reciprocating linear motion through the massage driving mechanism, and the massage head contacts with the human body, generating high-frequency vibration to act on deep muscle, thereby reducing local tissue tension, relieving pain, and promoting blood circulation.

In order to massage different parts of human body in a convenient manner, people have developed a kind of fascia gun whose massage head can rotate at a specified angle, which generally includes a handle and a steering head rotatably arranged at the upper end of the handle. However, after the massage head rotates to a non-initial angle, the axis of its reciprocating motion is difficult to coincide with the center of gravity of the fascia gun and relatively perpendicular to the holding direction of the handle, which is not conducive to application of force by a user and is difficult to maintain the impact depth on muscles. Therefore, people have developed a multi-handle fascia gun with multiple handles with different angles. For example, an impact massage device is disclosed in the prior art, which includes a housing, a power supply, a motor positioned in the housing, a motor switch, and a push rod assembly which is operably connected to the motor and configured to reciprocate in response to the activation of the motor. The housing includes a first handle, a second handle, and a third handle that cooperate to limit a handle opening, where the first handle limits a first axis, the second handle limits a second axis, and the third handle limits a third axis, and the first, second and third axes cooperate to form a triangle. All the handles are long enough so that they are configured to enable an individual to grasp a particular handle to utilize the device.

Users can use the massage device on different body parts and from different angles by holding different handles to press against body parts such as the back that may not be massaged without using three handles, so as to achieve better massage effect. However, the three handles of the massage device form a triangular structure. To ensure that the user's palm fully extends into the triangular cavity to hold the handles, either the handles need to be long enough or a large enough space should be reserved at the acute angle of the triangular cavity. However, all the above methods will cause the body of the massage device to be too large, which not only increases the manufacturing cost and the difficulty of use, but also causes space waste near the bottom of the triangular cavity due to the uncompacted structure of the body. Because the size of massage device is too large, it cannot be stored easily, and users can't hold the massage device tightly when the vibration is large during use, which reduces the massage effect and user experience.

BRIEF SUMMARY OF THE INVENTION

To solve the technical problem of the prior art, the invention provides a multi-handle fascia gun with more comfortable holding experience and better massage effect.

To solve the technical problem, the invention provides the following technical solution:

A multi-handle fascia gun is provided and includes a fascia gun body and a steering head, wherein the fascia gun body includes a fascia gun housing with a steering head housing, the head portion of the steering head is a steering head front mouth, and the tail portion thereof is a rotary fitting part rotatably mounted in the steering head housing; the fascia gun housing further includes a first handle, a third handle, a second handle, and a control handle connected in sequence; the axes of the first handle, the third handle, the second handle, and the control handle enclose a parallelogram;

- the steering head housing is disposed at the position where the first handle intersects with the control handle; and
- a joint of the first handle and the third handle, a joint of the second handle and the third handle, and a joint of the second handle and the control handle are all in smooth transition connection.

A handle with parallelogram structure can ensure that the center of gravity of the whole fascia gun can be kept coincident with an axis of impact force as far as possible when the steering head rotates to various angles, and a plurality of handles can be selected, ensuring that the axis of the impact force is perpendicular to a holding direction as much as possible, thereby reducing lateral counter-acting force and avoiding holding looseness. Generally, the lateral counter-acting force refers to counter-acting force parallel to a user's holding direction. Usually, the counter-acting force perpendicular to the user's holding direction can ensure the user to hold the handle tightly and help the user to apply force. In addition, this can also improve depth of the massage head installed on a steering head front mouth to impact a massage part and vertical depth of the impact force in muscle, thereby improving the massage effect.

Further, an included angle between the axis of the second handle and the axis of the third handle is 30°-80°.

Further, the fascia gun housing includes a first fascia gun housing, a second fascia gun housing, a first finishing component, and a second finishing component; the first fascia gun housing and the second fascia gun housing are coordinately connected with each other; and the front edges of the first fascia gun housing and the second fascia gun housing enclose a front gap, and the rear edges thereof enclose a rear gap, where the first finishing component is installed at the front gap, and the second finishing component is installed at the rear gap. The reasonable structural design facilitates assembly of internal parts and ensures structural strength and holding comfort. The design of the finishing components can increase aesthetics and improve overall effect.

Further, the rotary fitting part includes a motor housing, where an escape chute is formed on the steering head housing, the motor housing is rotatably installed in the steering head housing, and the steering head front mouth passes through the escape chute and moves along the escape chute. Rotating connection between the steering head and the fascia gun body is realized by a rotating connection between the motor housing and the steering head housing, and the escape chute is used to limit a rotating angle of the steering head.

Further, two ends of the motor housing are each provided with an escape hole which is a round hole, and a frustum rotatably fitting with the escape hole is arranged in the steering head housing. The escape hole and the frustum form a rotating structure in the form of hole-shaft fit, which is not only convenient to install and stable to fit, but also not easy to be damaged and has a long service life.

Further, the steering head housing is provided with a heat dissipation structure corresponding to the escape hole. The heat dissipation structure is used for heat dissipation of a motor in the motor housing.

Further, the heat dissipation structure includes at least two heat dissipation holes distributed in an annular array.

Further, the two ends of the motor housing are each provided with a soft rubber ring, and the inner hole of the soft rubber ring is a part of the axial hole section of the escape hole. The soft rubber ring can make connection between the motor housing and the steering head housing closer, thereby avoiding noise caused by vibration during use.

Further, when the axis of the steering head front mouth at the extreme position at one end of the escape chute is taken as a reference axis, the length of the escape chute meets the requirement that an included angle between the axis of the steering head front mouth and the reference axis is adjustable within the range of 0°-150°. The steering head front mouth can be adjusted within the range of 0°-150° degrees, which can meet the massage requirements of most users for muscles of various body parts. Moreover, the steering head front mouth being adjusted within the range of 0°-150° degrees ensures that the axis of reciprocating motion of the massage head on the steering head be kept as vertical as possible relative to a massage part, thus ensuring impact depth on muscles during massage process.

Further, the steering head includes a first steering head housing and a second steering head housing which are coordinately connected. A structure spliced by two housings can facilitate installation of internal parts.

Further, the multi-handle fascia gun includes a motor assembly, where the motor assembly includes a motor and a motor bracket, the motor housing is internally provided with an assembly accommodating chamber, and the side wall of the assembly accommodating chamber is provided with an escape hole; the motor bracket is suspended in the assembly accommodating chamber and connected with the fascia gun housing by a connecting structure passing through the escape hole; and the motor is suspended in the assembly accommodating chamber and connected with the motor bracket. The motor is suspended and installed in the assembly accommodating chamber through the motor bracket, which can ensure that vibration generated when the motor works will not be transmitted to the steering head and avoid the steering head from shaking and generating abnormal sound. Moreover, because the motor and the motor bracket are suspended in the assembly accommodating chamber, the motor and the motor bracket will not rotate with the steering head, rendering better fixing effect.

Further, the connecting structure includes a connecting rod arranged on the motor bracket, the connecting end of a connecting rod passes through the assembly accommodating chamber from the escape hole and is connected with the fascia gun housing, and the connecting structure composed of the connecting rods is simple in structure and convenient to manufacture and install; or the connecting structure includes a motor connecting part arranged on the fascia gun housing which penetrates into the assembly accommodating chamber from the escape hole and is connected with the motor bracket; the connecting structure can not only enhance the strength of the fascia gun housing, but also facilitate rotating connection and improve stability of cooperation between the rotary fitting part and the fascia gun housing, helping to prolong service life of the fascia gun; or the connecting structure includes a connecting rod arranged on the motor bracket and a motor connecting part arranged on the fascia gun housing, where the motor connecting part penetrates into the assembly accommodating chamber from the escape hole, and the connecting end of the connecting rod is connected with the motor connecting part. A connecting structure composed of a connecting rod and a motor connecting part has both the above advantages, only slightly increasing complexity of a structure and having low cost.

Further, there are at least two connecting rods, and a wall is arranged between any two adjacent connecting rods. The wall can make the connecting rods form a whole, increasing its structural strength and improving stability of motor installation.

Further, the connecting end of a connecting rod is provided with a pillow block, and the pillow block is sleeved with an anti-vibration sleeve abutting against the fascia gun housing. The connecting rod and the anti-vibration sleeve are fixed onto the fascia gun housing by screws, and the anti-vibration sleeve is abutted against the fascia gun housing, so that vibration transmitted by the motor to a connecting rod can be buffered by the anti-vibration sleeve, which reduces vibration transmitted to the fascia gun housing and avoids abnormal sound caused by vibration, collision and the like.

Further, the fascia gun further includes a driving assembly, where the driving assembly includes a sliding sleeve, a piston rod, a transmission arm, and an eccentric wheel; the steering head is internally provided with a massage output hole; the sliding sleeve is arranged in the massage output hole, the piston rod is slidably installed in the sliding sleeve, the eccentric wheel is arranged on the output end of the motor, one end of the transmission arm is hinged with the tail end of the piston rod, and the other end thereof is hinged with the eccentric shaft of the eccentric wheel; and when the steering head rotates to any angle, the transmission arm does not interfere with the connecting rod. The driving assembly as a whole is similar to a reciprocating mechanism in a conventional fascia gun. Just considering that the steering head should rotate, it is necessary to ensure that a rotating shaft of the steering head being designed and installed is coaxial with that of the motor, and to avoid interference between the connecting rod and the driving assembly.

Further, the sliding sleeve is nested in the massage output hole through a vibration damping sleeve. The vibration damping sleeve is mainly used to reduce noise generated during reciprocating motion of a piston rod.

Further, the multi-handle fascia gun further includes a control assembly, where the control assembly includes a main control board and a battery both which are arranged in the fascia gun housing, and the motor and the battery are electrically connected with the main control board respectively.

Further, the first handle and the third handle are both provided with the battery, and the main control board is arranged in the second handle.

Further, the motor housing of the rotary fitting part is provided with a motor outlet slot, the motor is electrically connected with the main control board through a motor power cord, and when the motor power cord passes through the motor outlet slot and the steering head rotates to any angle, the motor power cord does not interfere with the motor housing. With a specified length of motor power cord being reserved, the motor power cord will not rotate with the steering head, and basically will not rub against the motor housing, thus avoiding problems such as fracture of the motor power cord or its skin breakage and short circuit.

Further, the control assembly further includes a charging interface arranged on the third handle, and the charging interface is electrically connected with the main control board.

Further, the control assembly further includes a display screen arranged on the control handle, and the display screen is electrically connected with the main control board.

Further, the control assembly further includes a power switch and a power button, where the power switch is arranged in the control handle and electrically connected with the main control board, and the power button is arranged on the control handle and corresponds to the power switch.

Further, the multi-handle fascia gun further includes a steering head locking assembly, where the steering head locking assembly includes clamping holes, a movable bracket, an elastic piece, and an unlock key;

- the clamping holes are arranged in the outer edge of the rotary fitting part, and clamping holes are provided in at least two and distributed at intervals along the rotating direction of the rotary fitting part;
- the movable bracket is movably installed in the control handle, and a rotation stop part is arranged on the movable bracket and can be inserted into the clamping hole;
- the elastic piece is arranged in the control handle, and can drive the movable bracket to move in the direction close to the rotary fitting part, so that the rotation stop part can be inserted into the clamping hole corresponding to the rotation stop part; and
- the unlock key is movably installed on the control handle and capable of moving towards the inside of the control handle under the pressing action of external force, so that the movable bracket moves away from the rotary fitting part, and the rotation stop part is detached from the corresponding clamping hole (610).

In order to realize the function of the steering head locking assembly, the invention provides three specific schemes:

In Scheme 1, the movable bracket is provided with a baffle and a guide block at intervals, the side of the guide block close to the baffle is a inclined guide surface, and the rotation stop part is arranged on the outer side of the baffle; the elastic piece is a spring arranged on the inner side of the baffle, and the free end of the spring corresponds to the inclined guide surface; and the lower end of the unlock key is a guide part, and the guide part corresponds to the position between the spring and the inclined guide surface.

Further, the guide part is wedge-shaped and has an inclined plane corresponding to the inclined guide surface with same inclination.

Further, the inclined guide surface is provided with a positioning groove, and the guide part is provided with a positioning block adapted to the positioning groove.

Further, the steering head locking assembly further includes a fixed bracket arranged in the control handle, a bracket guide groove is formed in the fixed bracket, and the movable bracket is slidably arranged in the bracket guide groove.

Scheme 1 is mainly to realize movement of the movable bracket by matching the movable bracket with inclined plane of the unlock key, so as to realize clamping and detachment of the rotation stop part and the clamping hole, which is stable and reliable.

In Scheme 2, the movable bracket is rotatably installed in the control handle through a rotating shaft, and the movable bracket includes a rotating part sleeved on the rotating shaft, and a rotation stop part and a pressing end both which are arranged on the rotating part; the inner end of the unlock key corresponds to the pressing end; when moving towards the inside of the control handle, the unlock key is capable of pushing the pressing end to drive the movable bracket to rotate, and driving the rotation stop part to detach from the clamping hole into which the unlock key is inserted; and when no external force is applied to the unlock key, the rotation stop part is capable of being pushed under the elastic force of the elastic piece so as to drive the rotation of the movable bracket, and then the unlock key is pushed back by the pressing end for resetting.

Further, the elastic piece is a torsion spring; with the elastic piece being in a pre-tightening state, one torsion leg of the elastic piece is abutted against the limiting structure inside the control handle, and the other torsion leg thereof is abutted against the rotation stop part.

Further, an included angle between the rotation stop part and the pressing end is an obtuse angle, and the side of the rotation stop part away from the pressing end is the outer side thereof; the elastic piece is sleeved on the rotating shaft, and the torsion leg of the elastic piece near the rotation stop part passes through the rotation stop part along the outer side of the rotation stop part.

In Scheme 2, the rotation stop part is inserted or separated from the clamping hole mainly by rotating the movable bracket, and the structure is simpler than that in Scheme 1.

Scheme 3, where the movable bracket is slidably installed in the control handle through a slide rail, and the movable bracket includes a sliding part slidably fitting with the slide rail, and a rotation stop part and a key stop end both which are arranged on the sliding part; the rotation stop part is a lug with a trapezoidal longitudinal section, and the clamping hole is a trapezoidal groove matching with the rotation stop part; the unlock key is provided with a guide section; when no external force is applied to the unlock key, the guide section is abutted against the key stop end; and when external force is applied to the unlock key, the guide section and the key stop end are staggered, so that the rotation stop part is detachable from the clamping hole in which the rotation stop part is inserted under the external force.

Further, the elastic piece is a torsion spring, and the control handle is internally provided with a torsion spring limiting structure; with the elastic piece being in a pre-tightening state, one torsion leg of the elastic piece is abutted against the torsion spring limiting structure, and the other torsion leg thereof passes through the rotation stop part.

Further, the control handle is internally provided with a key limiting structure in which a key through hole is formed, the unlock key is slidably installed in the key through hole, a spring column is arranged at the position of the unlock key in the control handle and sleeved with a button reset spring, and both ends of the button reset spring are each abutted against the key limiting structure and the unlock key.

The principle of Scheme 3 is similar to that of Scheme 1, and locking is realized by sliding of the movable bracket, with better locking stability achieved by locking the movable bracket by the abutment of the unlock key and the movable bracket.

The beneficial effect of the invention is as follows:

(1) In the multi-handle fascia gun, the fascia gun housing has a parallelogram structure, which can ensure that the center of gravity of the whole fascia gun can be kept coincident with an axis of impact force as far as possible when the steering head rotates to various angles, and a plurality of handles can be selected, ensuring that the axis of the impact force is perpendicular to a holding direction as much as possible, thereby reducing lateral counter-acting force and avoiding holding looseness. In addition, this can also improve depth of the massage head installed on a steering head front mouth to impact a massage part and vertical depth of the impact force in muscle, thereby improving the massage effect.

(2) An included angle between the axis of a second handle and the axis of a third handle is 30°-80°, which can ensure that the axis of a first handle, the axis of a third handle, the axis of a second handle, and the axis of a control handle are enclosed into an oblique parallelogram; as compared with a fascia gun with triangular structure, upper and lower parts of its holding space are non-included-angle structures, with enough space for fingers to enter, and it is not necessary to lengthen the first handle and the second handle, and the size of the fascia gun body will not be excessively increased. Meanwhile, inclined arrangement of the third handle not only ensures that the third handle has enough holding length, but also ensures that the lower part of holding space is basically free of space waste, so that a main structure of the fascia gun is more compact and reasonable, which is beneficial to stable holding of users and improves user experience.

Figure 1:
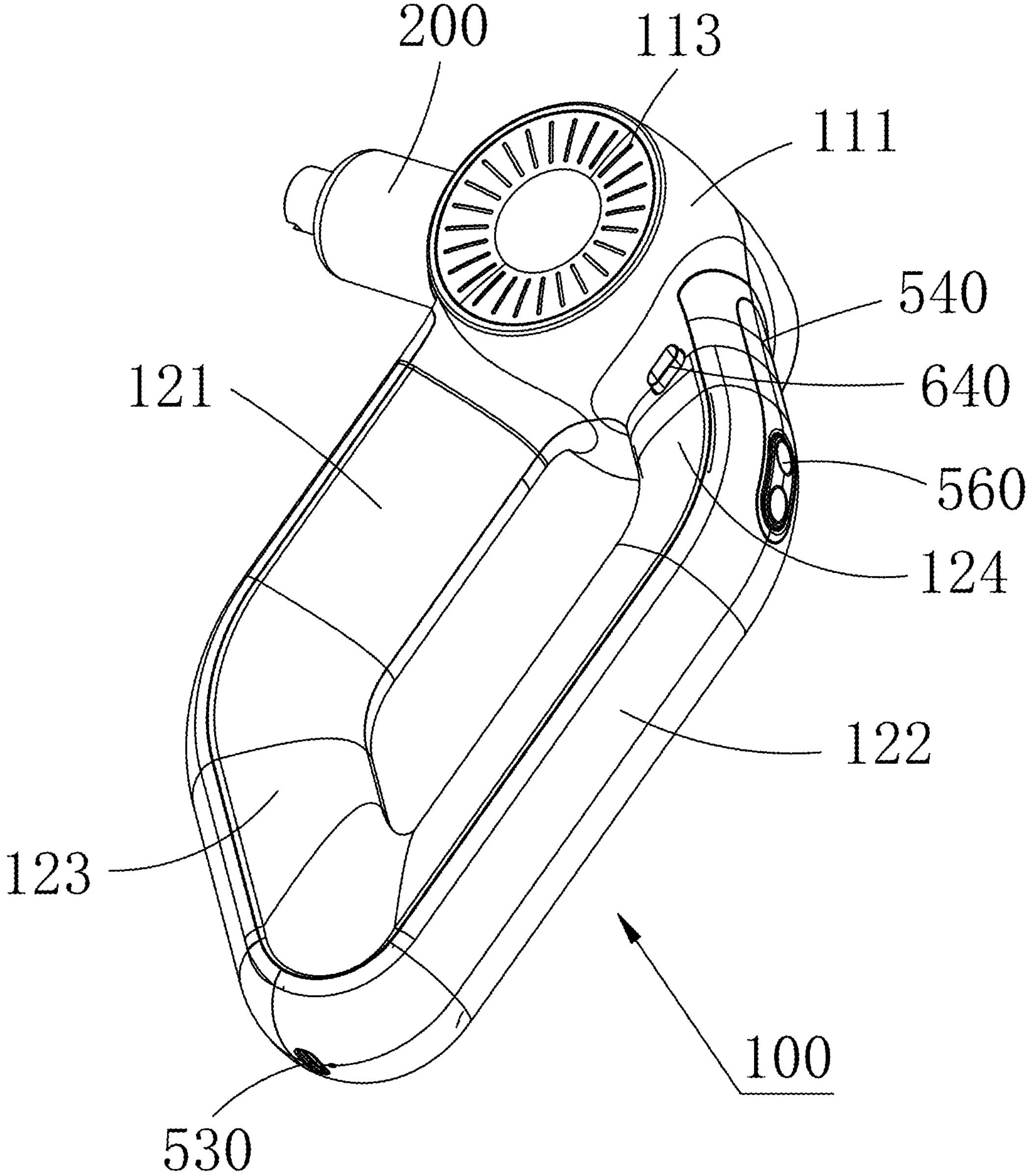
FIG. 1 is a schematic view of the implementation structure of the multi-handle fascia gun according to the invention.

Symbols in the figures are as follows: fascia gun body 100, fascia gun housing 110, steering head housing 111, frustum 112, heat dissipation hole 113, escape chute 114, first fascia gun housing 115, second fascia gun housing 116, first finishing component 117, second finishing component 118, rotating shaft 120, first handle 121, second handle 122, third handle 123, control handle 124, torsion spring limiting structure 130, slide rail 140, steering head 200, assembly accommodating chamber 201, escape hole 202, massage output hole 203, vibration damping sleeve 204, soft rubber ring 205, motor outlet slot 206, first steering head housing 211, second steering head housing 212, rotary fitting part 220, steering head front mouth 230, motor 310, motor bracket 320, connecting rod 321, wall 322, pillow block 323, anti-vibration sleeve 324, sliding sleeve 410, piston rod 420, transmission arm 430, eccentric wheel 440, main control board 510, battery 520, charging interface 530, display screen 540, power switch 550, power button 560, clamping hole 610, movable bracket 620, rotation stop part 621, baffle 622, inclined guide surface 623, positioning groove 624, rotating part 625, pressing end 626, sliding part 627, key stop end 628, elastic piece 630, unlock key 640, guide part 641, positioning block 642, guide section 643, spring column 644, button reset spring 645, fixed bracket 650, and bracket guide groove 651.

DETAILED DESCRIPTION OF PREFERRED EMBODIMENTS OF THE INVENTION

The invention is further described in combination with the drawings as follows:

It should be noted that, in the description of the Invention, the azimuth or positional relationship indicated by the terms "front", "rear", "left", "right", "upper", "lower", "top", "bottom", "head", "tail", "inside" and "outside" are based on the azimuth or positional relationship shown in the drawings, and are used only for convenience for description, rather than indicating or implying that the indicated device or component must have a specific orientation, or be constructed and operated in a specific orientation, and therefore should not be construed as limitation to the invention. In addition, the terms "first" and "second" are only used for descriptive purpose and cannot be understood as indicating or implying relative importance.

As shown in FIG. 1, a multi-handle fascia gun includes a fascia gun body 100 and a steering head 200, where the fascia gun body 100 includes a fascia gun housing 110 with a steering head housing 111, the head portion of the steering head 200 is a steering head front mouth 230, and the tail portion thereof is a rotary fitting part 220 rotatably mounted in the steering head housing 111; the fascia gun housing 110 further includes a first handle 121, a third handle 123, a second handle 122, and a control handle 124 connected in sequence; the axes of the first handle 121, the third handle 123, the second handle 122, and the control handle 124 enclose a parallelogram;

the steering head housing 111 is disposed at the position where the first handle 121 intersects with the control handle 124; and a joint of the first handle 121 and the third handle 123, a joint of the second handle 122 and the third handle 123, and a joint of the second handle 122 and the control handle 124 are all in smooth transition connection.

As shown in FIG. 1, the parallelogram in the invention refers to an ordinary parallelogram, that is, an oblique parallelogram has two acute angles and two obtuse angles and is also called a non-rectangular parallelogram; the first handle 121 and the second handle 122 are arranged at intervals, the upper end of the first handle 121 is higher than that of the second handle 122, and the lower end of the first handle 121 is higher than that of the second handle 122; the steering head housing 111 is arranged at the upper end of the first handle 121 and is in smooth transition connection with the upper end of the second handle 122 through the control handle 124; and the third handle 123 is obliquely arranged, and its upper end is in smooth transition connection with the lower end of the first handle 121, and its lower end is in smooth transition connection with the lower end of the second handle 122.

Compared with the existing fascia gun with a triangular handle, the parallelogram handle adopted by the invention has many advantages. Specifically, when judging the advantages and disadvantages of a handle, it is mainly considered from two aspects. First, whether the handle itself is comfortable to hold and meets the ergonomic design requirements; second, whether the cooperation between the handle and the massage head is coordinated and whether the user's use burden can be reduced.

Firstly, as far as the handle itself is concerned, when the second handle 122 is held by one hand, the thumb and forefinger can be placed on the control handle to form a support, so that the thumb and forefinger are not suspended when holding the second handle 122 close to the control handle or the thumb and forefinger cannot be supported according to the bending direction of the thumb and forefinger, so that a better holding feel can be obtained, such as the holding state when massaging legs, hands and other parts. For another example, when holding the third handle 123 with one hand, the thumb and forefinger can be placed on the first handle 121 to form a support, such as the holding state when massaging the back and other parts. Of course, in addition to the above-mentioned holding methods, the thumb and forefinger can also be supported when holding another handle, especially when holding a handle near an adjacent handle. In case of a triangular handle structure, it is difficult to support the thumb and forefinger on an adjacent handle because of a small included angle between a handle and its adjacent handle. In the process of using the fascia gun, the holding position may be changed to adjust the direction and position of hitting and massaging. When holding a handle near its adjacent handle, the thumb and forefinger can be supported to improve the stability of the holding state and ensure the comfortable holding.

Secondly, the first handle 121, the second handle 122, the third handle 123, and the control handle 124 in the parallelogram handle of the invention can all be used for holding, so as to adjust the extension distance of the steering head 200 relative to a massage part of a human body, thereby adapting to massage of different parts of a body and different needs. For example, holding the third handle 123, which is far away from the steering head 200, can massage the back and other parts of a human body, and holding the first handle 121 or the control handle 124, which is close to the steering head 200, can realize close-range accurate massage. The first handle 121, the second handle 122, the third handle 123, and the control handle 124 can all be designed in different sizes according to users. A user can adjust the angle of the steering head 200 and the handle suitable for holding according to different body parts to be hit, and can hold two handles with both hands to operate when the user wants to massage intensively. For example, holding the first handle 121 and the second handle 122 with both hands, or holding the joint between the third handle 123 and the first handle 121 with one hand, and holding the joint between the control handle 124 and the second handle 122 with the other hand, can ensure the comfort of holding because the joint parts are obtuse and in smooth transition.

For another example, when a user holds the second handle 122 near the end of the third handle 123, the smooth transition connection structure can make the little finger rest on the third handle 123 to form a support. Therefore, in addition to directly holding the first handle 121, the second handle 122, the third handle 123, and the control handle 124, the user can also hold a joint of two adjacent handles, which is exactly because of the parallelogram structure where fingers that cannot pass through the handle can be placed and supported on the adjacent handle when the user holds the handle at the joint.

Thirdly, compared with the handle with triangular structure, the middle cavity of the parallelogram handle is long, and the upper and lower parts of the holding space have larger included angles. In particular, it has a structure that forms an obtuse angle. The formed elongated cavity has enough space for fingers to extend into. Compared with the triangular handle structure, after the first handle 121 and the second handle 122 with shorter length are enclosed to form the handle structure, the size of the whole fascia gun body 100 can be effectively controlled to be relatively small. Meanwhile, the inclined arrangement of the third handle 123 not only ensures that the third handle 123 has sufficient holding length, but also ensures that the lower part of the holding space is basically free of space waste, so that the structure of the fascia gun body 100 is more compact and reasonable, which is beneficial to stable holding of users and improves user experience. For example, when a user holds the first handle 121 with the left hand and holds the second handle 122 with the right hand, the thumb of the left hand and the four fingers of the right hand except the thumb can be inserted into the cavity of the parallelogram at the same time, and then the first handle 121 and the second handle 122 can be held with the other fingers. When the user holds the control handle 124 with the left hand and the third handle 123 with the right hand, the thumb of the left hand can be inserted into the cavity of the parallelogram, and then the control handle 124 or the joint between the control handle 124 and the second handle 122 can be grasped with the other four fingers, while the other two or three fingers of the right hand except the thumb can be inserted into the cavity of the parallelogram and hold the third handle 123 or the joint between the third handle 123 and the first handle 121 with the thumb, which can well meet change of holding mode in various use states, and has good fit to the palm, improving comfort in the holding state.

Fourthly, the most important function of the handle with parallelogram structure is to easily cooperate with the steering head 200 to meet various massage needs, and to better balance the impact counter-acting force, so that users can use the fascia gun more easily. When holding the fascia gun, a user mainly overcomes two forces, one is the vertical downward gravity, and the other is the impact counter-acting force transmitted from the massage head during the massage. When the handle with the parallelogram structure is adopted, fingers are inserted into the cavity of the parallelogram when holding the handle, so that gravity can be well overcome in any holding posture, with the center of gravity of the fascia gun being close to the holding position, thereby reducing torque effect generated by gravity and fatigue feeling of hands. In addition, when the steering head 200 rotates to various angles, the center of gravity of the whole fascia gun can be kept approximately coincident with the axis of the impact force, and a plurality of handles can be selectively held according to the hitting direction, ensuring that the axis of the impact force is perpendicular to the axis of the holding handles as much as possible, much as possible, thereby reducing lateral counter-acting force and avoiding holding looseness. Usually, the counter-acting force perpendicular to the user's holding direction can ensure the user to hold the handle tightly and help the user to apply force. In addition, when the user holds the handles with both hands, two opposite handles in the parallelogram are generally held. Because the two opposite handles are parallel, the included angle between the axis of the reciprocating motion of the massage head and the two held handles is the same, so the magnitude and direction of the force on the two handles are the same, which can evenly divide the force and facilitate the cooperation between two hands. When the triangular handle is held by both hands, the force on both hands is different in magnitude and direction, causing lower comfort of use. To sum up, the parallelogram handle of the invention can better reduce the hand fatigue when a user holds the handle and improve user experience.

For users of a fascia gun, in addition to the experience in holding and using the fascia gun, the overall sensory effect is also a reference factor for them to choose products. Compared with an angular triangular handle, a parallelogram handle is more rounded, which can make the palm and handle fit better and has a good holding feel.

With an overall size smaller than that of the triangular handle, the parallelogram handle has a more compact structure, with symmetrical stress, and the structural strength of the material can be controlled easilier, thereby reducing design and production costs. In addition, internal devices can be integrated and installed in multiple handles. Compared with the triangular handle, the parallelogram handle has a larger internal available space and a larger internal device separation space, thereby improving dissipation effect of heat generated during operation.

The following are some optimization and improvements made by the invention to improve the overall structure of the fascia gun.

In order to ensure that the holding position can be changed to adjust the extension distance of the massage head and ensure that a palm can pass through the enclosed oblique parallelogram holding space, it is preferable that the included angle between the axis of the second handle 122 and the axis of the third handle 123 is 30°-80°. That is, the acute angle of the enclosed oblique parallelogram is 30°-80°, and the obtuse angle is 100°-150°. The included angle range and appropriate chamfers for transition can improve the holding comfort when a user holds the handle, and further ensures that the thumb, forefinger or little finger can be placed on the adjacent handle to form a support after holding the adjacent handle.

Figure 2:
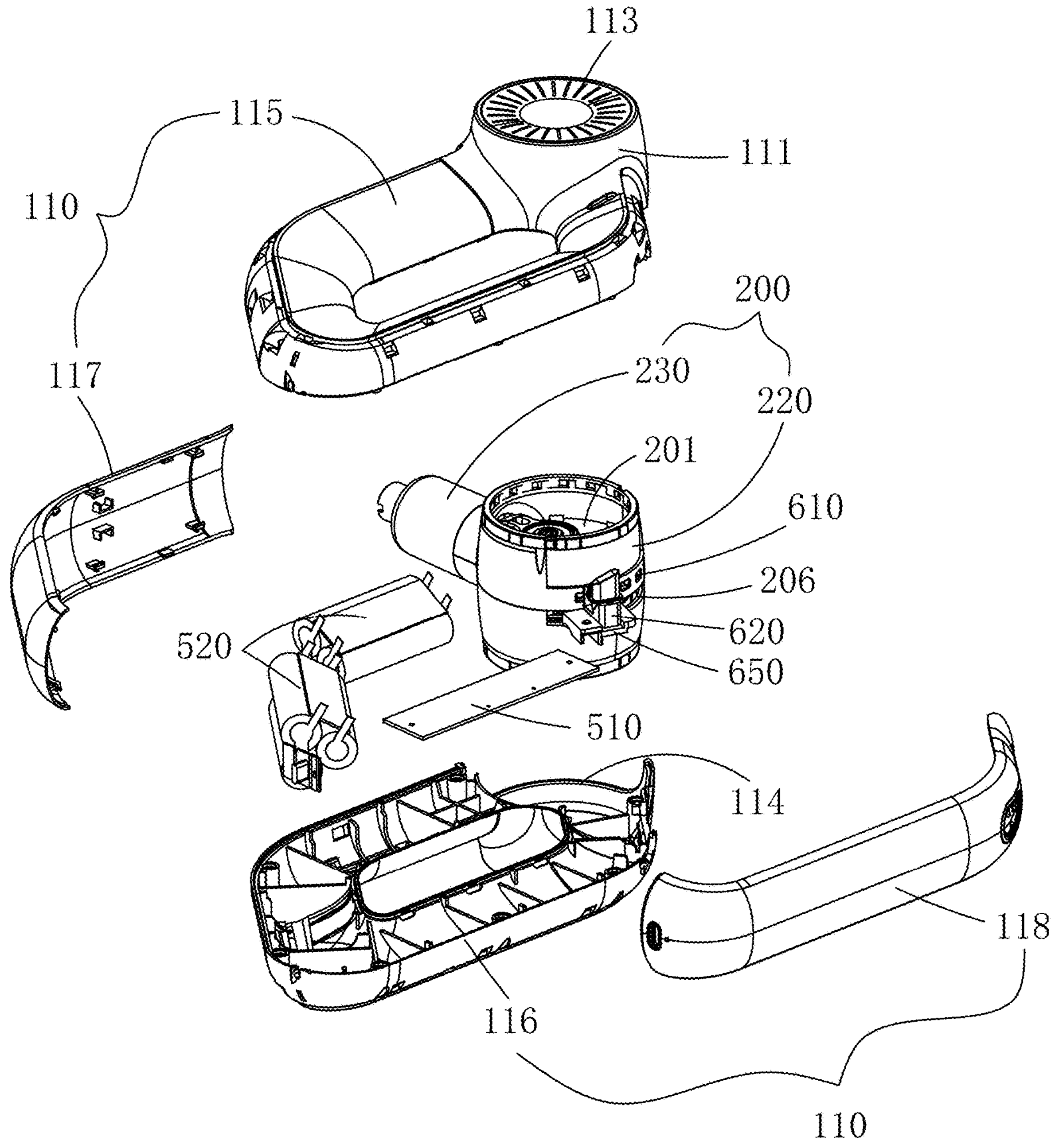
FIG. 2 is a three-dimensional exploded drawing of the multi-handle fascia gun according to the invention.

As for the assembly structure of the handle, as shown in FIG. 1 and FIG. 2, the fascia gun housing 110 includes a first fascia gun housing 115, a second fascia gun housing 116, a first finishing component 117, and a second finishing component 118; the first fascia gun housing 115 and the second fascia gun housing 116 are coordinately connected with each other; and the front edges of the first fascia gun housing 115 and the second fascia gun housing 116 enclose a front gap, and the rear edges thereof enclose a rear gap, where the first finishing component 117 is installed at the front gap, and the second finishing component 118 is installed at the rear gap. The fascia gun housing 110 has a simple structure and is convenient to manufacture and assemble. The first fascia gun housing 115 and the second fascia gun housing 116 can be coordinately connected in a variety of ways, and it is preferable to fix them by snap and then install them by screw locking. The first finishing component 117 is usually a part fitting with the front gap, which can completely cover the front gap. The second finishing component 118 is usually a part fitting with the rear gap, which can completely cover the rear gap. The whole handle is composed of the first fascia gun housing 115, the second fascia gun housing 116, the first finishing component 117, and the second finishing component 118, which are divided up and down, so that the number of components of the handle is reduced, which is beneficial to integrally molding the above components, improving structural strength and stability, reducing number of splicing positions of the handle, and reducing probability of burr formation at the splicing positions.

Generally, both the first fascia gun housing 115 and the second fascia gun housing 116 of the fascia gun are provided with curved surfaces extending inward. The curved surfaces on the first finishing component 117 and the second finishing component 118 are enclosed with the curved surfaces on the first fascia gun housing 115 and the second fascia gun housing 116 to form a part on the fascia gun housing 110 that is convenient to hold, and the curved surfaces gradually decrease in curvature from the outside to the inside, forming a fitting degree that fits the curved surface of the palm. It is ensured that the hand can naturally fit the curved surface when grasping the handle, and it is suitable for different sizes of palms to hold well, for example, men's palms with larger sizes and women's palms with smaller sizes can get good holding feel, and the palm surface fitting the handle has a good bearing effect on the opposite acting force, so that the reverse vibration in the use process can be reduced.

There are many ways for rotatably matching the rotary fitting part 220 with the fascia gun housing 110, such as nested fitting and rotating shaft connection. In order to facilitate assembly and improve the stability of rotary installation, preferably, as shown in FIG. 1, FIG. 2, and FIG. 3, the rotary fitting part 220 includes a motor housing, an escape chute 114 is formed in the steering head housing 111, the motor housing is rotatably installed in the steering head housing 111, and the steering head front mouth 230 passes through the escape chute 114 and moves along the escape chute 114.

Figure 5:
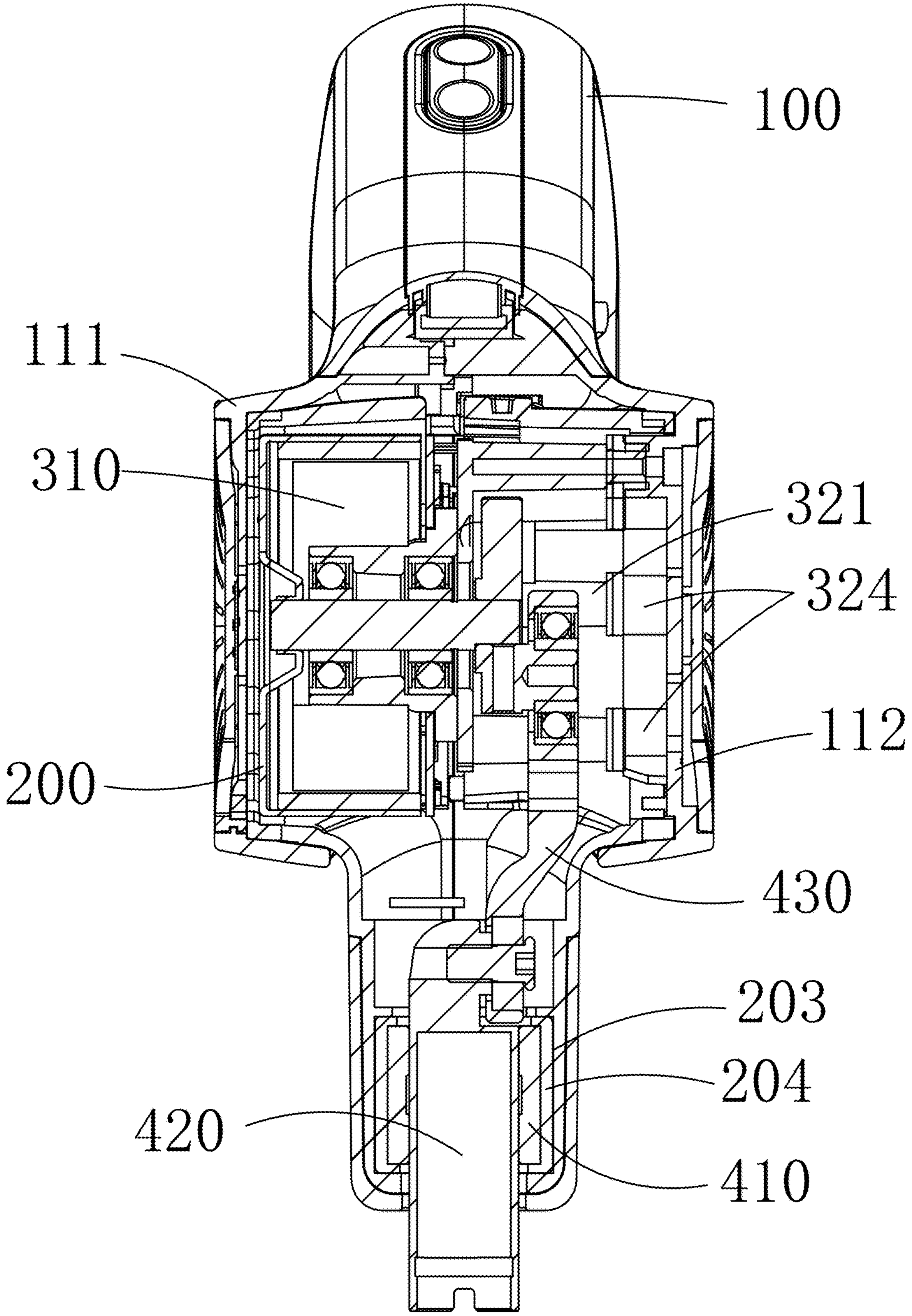
FIG. 5 is a schematic sectional view of the steering head according to the invention.

In order to facilitate the rotatable matching, as shown in FIG. 2 and FIG. 5, two ends of the motor housing are each provided with an escape hole 202 which is a round hole, and the steering head housing 111 is internally provided with a frustum 112 rotatably matching with the escape hole 202. The escape hole 202 and the frustum 112 form a rotating structure in the form of hole-shaft fit, and the frustum 112 supports the steering head housing 111, so that the steering head housing 111 can rotate relatively. When a direction of impact force is adjusted, a smooth rotation adjustment process can be obtained, and the steering head housing 111 can be prevented from being deformed in the long-term relative rotation process.

Figure 3:
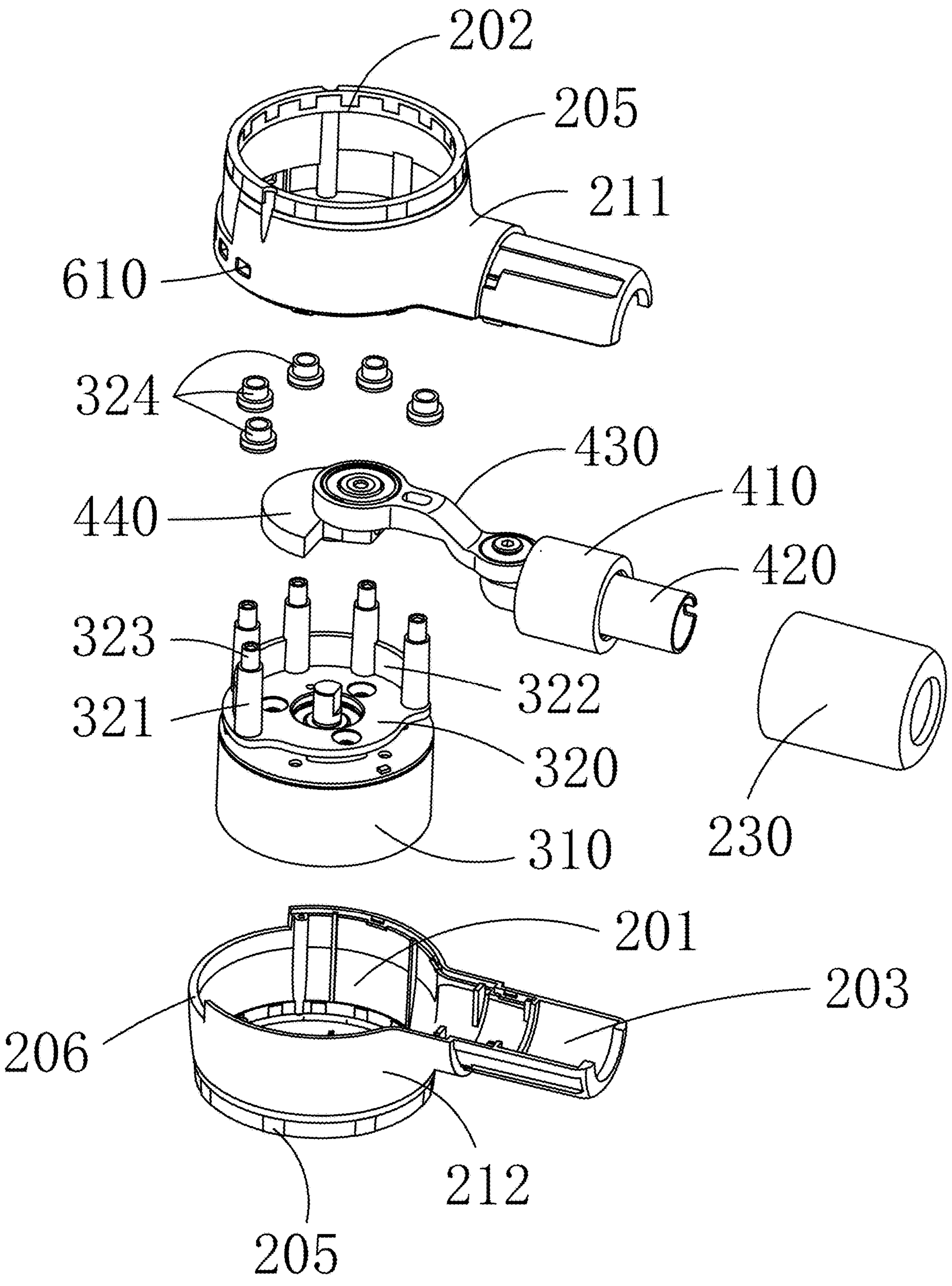
FIG. 3 is a three-dimensional exploded drawing of the steering head and the driving assembly according to the invention.

On the basis of the above, in order to facilitate the assembly and the heat dissipation of the motor 310, as shown in FIG. 3 and FIG. 5, the steering head housing 111 is provided with a heat dissipation structure corresponding to the escape hole 202. There are many kinds of heat dissipation structures, such as plate structure and block structure, and the heat dissipation structure can be installed on the steering head housing 111 by snap connection, fastening screw connection, and the like. As shown in FIG. 1 and FIG. 2, the heat dissipation structure includes at least two heat dissipation holes 113 distributed in an annular array.

In order to protect the steering head 200 and prevent it from colliding with the fascia gun housing 110 to generate abnormal sound, as further shown in FIG. 2 and FIG. 3, the two ends of the motor housing are each provided with a soft rubber ring 205, and the inner hole of the soft rubber ring 205 is a part of the axial hole section of the escape hole 202. The soft rubber ring 205 is usually made of a flexible or elastic material. Preferably, the soft rubber ring 205 is a structure integrated with the motor housing, and this structure is generally formed by injection molding with a two-color mold. The soft rubber ring 205 is formed by soft rubber, and the motor housing is formed by hard rubber. Soft rubber is the name given by the general plastics industry to plastics such as PP and PE with light specific gravity and relatively low surface hardness, while hard rubber is the name given by the general plastics industry to plastics such as PS, ABS, AS, and rigid PVC.

Preferably, when the axis of the steering head front mouth 230 at the extreme position at one end of the escape chute 114 is taken as a reference axis, the length of the escape chute 114 meets the requirement that an included angle between the axis of the steering head front mouth 230 and the reference axis is adjustable within the range of 0°-150°. The steering head front mouth 230 can be adjusted within the range of 0°-150° degrees, which can meet the massage requirements of most users for muscles of various body parts. Moreover, the steering head front mouth being adjusted within the range of 0°-150° degrees and the use of three handles ensure that the axis of reciprocating motion of the massage head on the steering head 200 be kept as vertical as possible relative to a massage part, thus ensuring impact depth on muscles during massage process.

The steering head 200 is an angle-adjustable power output part of the multi-handle fascia gun and generally includes a steering head housing, a motor assembly, a driving assembly, and the like, on which different massage heads can be installed for massage. Specifically, as shown in FIG. 2 and FIG. 3, the steering head 200 includes a first steering head housing 211 and a second steering head housing 212 coordinately connected. The first steering head housing 211 and the second steering head housing 212 may be vertically matched or horizontally matched.

As shown in FIG. 1, FIG. 2, FIG. 3, and FIG. 4, the multi-handle fascia gun further includes a motor assembly, wherein the motor assembly comprises a motor 310 and a motor bracket 320, the motor housing is internally provided with an assembly accommodating chamber 201, and the side wall of the assembly accommodating chamber 201 is provided with an escape hole 202; the motor bracket 320 is suspended in the assembly accommodating chamber 201 and connected with the fascia gun housing 110 by a connecting structure passing through the escape hole 202; there are many connecting structures, such as connecting rods, lug bosses, connectors, and the like; and the motor 310 is suspended in the assembly accommodating chamber 201 and connected with the motor bracket 320.

The motor bracket 320 is connected with the fascia gun housing 110 through the connection structure passing through the escape hole 202, so that it is suspended in the assembly accommodating chamber, which can ensure that vibration generated when the motor 310 works will not be transmitted to the steering head 200 and avoid the steering head 200 from shaking and generating abnormal sound. Moreover, because the motor 310 and the motor bracket 320 are suspended in the assembly accommodating chamber 201, the motor 310 and the motor bracket 320 will not rotate with the steering head 200, rendering better fixing effect.

Preferably, the connecting structure includes a connecting rod 321 arranged on the motor bracket 320, the connecting end of the connecting rod 321 passes through the assembly accommodating chamber 201 from the escape hole 202 and is connected with the fascia gun housing 110, and the connecting structure composed of the connecting rods 321 is simple in structure and convenient to manufacture and install; or the connecting structure includes a motor connecting part arranged on the fascia gun housing 110 which penetrates into the assembly accommodating chamber 201 from the escape hole 202 and is connected with the motor bracket 320; the connecting structure formed by motor connecting part can not only strengthen the strength of the fascia gun housing 110, but also facilitate rotating connection and improve stability of cooperation between the rotary matching part 220 and the fascia gun housing 110, helping to prolong service life of the fascia gun; or the connecting structure includes a connecting rod 321 arranged on the motor bracket 320 and a motor connecting part arranged on the fascia gun housing 110, where the motor connecting part penetrates into the assembly accommodating chamber 201 from the escape hole 202, and the connecting end of the connecting rod 321 is connected with the motor connecting part. The connecting structure composed of the connecting rod 321 and the motor connecting part has both the above advantages, only slightly increasing complexity of a structure and having low cost.

Figure 4:
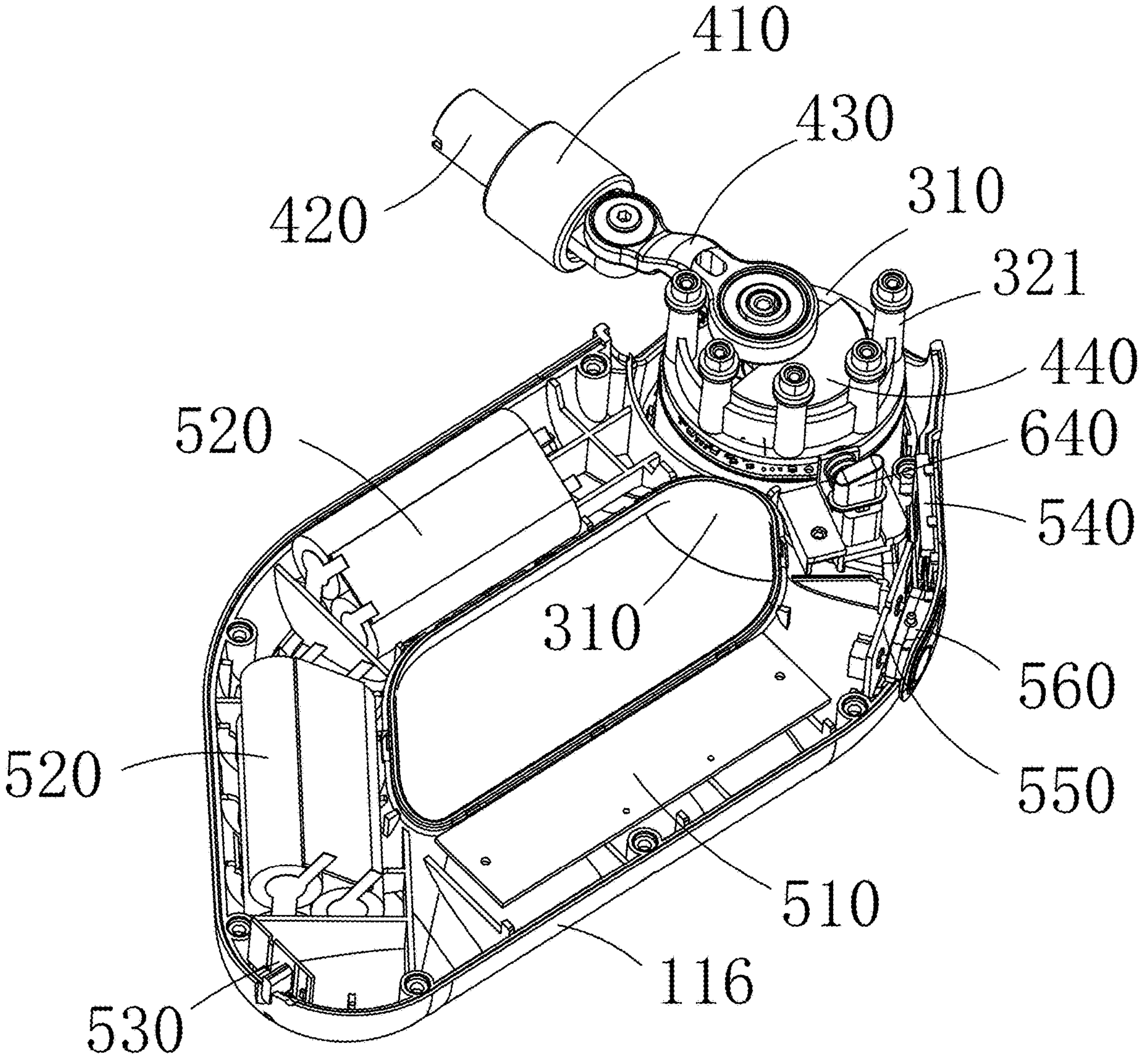
FIG. 4 is a three-dimensional structural schematic diagram with h the first housing of the fascia gun disassembled according to the invention.

The connecting rod 321 is usually arranged at the edge of the motor bracket 320, and its structure can be circular column, prismatic column, polygonal column, conical column, and the like. In order to increase the strength and connection stability of the whole motor bracket 320, as shown in FIG. 3, there are at least two connecting rods 321, and a wall 322 is arranged between any two adjacent connecting rods 321. In the embodiment of FIG. 3 and FIG. 4, five connecting rods 321 are arranged at intervals along the edge of the motor bracket 320.

In order to reduce vibration transmitted from the motor 310 to the fascia gun housing 110 and avoid abnormal sound, as shown in FIG. 3 and FIG. 4, the connecting rod 321 can be a rivet column or a screw column. For convenience of disassembly, a screw column is preferred, which is fixedly connected with the fascia gun housing 110 by screws. The connecting end of the connecting rod 321 is provided with a pillow block 323, and the pillow block 323 is sleeved with an anti-vibration sleeve 324 abutting against the fascia gun housing 110. The anti-vibration sleeve 324 is usually made of a flexible or elastic material, preferably rubber or silica gel. The connecting rod 321 and the anti-vibration sleeve 324 are fixed onto the fascia gun housing 110 by screws, and the anti-vibration sleeve 324 is abutted against the fascia gun housing 110, so that vibration transmitted by the motor 310 to the connecting rod 321 can be buffered by the anti-vibration sleeve 324, which reduces vibration transmitted to the fascia gun housing 110 and avoids abnormal sound caused by vibration, collision and the like.

As shown in FIG. 3, FIG. 4, and FIG. 5, the fascia gun further includes a driving assembly, and the driving assembly includes a sliding sleeve 410, a piston rod 420, a transmission arm 430, and an eccentric wheel 440. The steering head 220 is internally provided with a massage output hole 203, and the massage output hole 203 is formed by enclosing the first steering head housing 211 and the second steering head housing 212. The sliding sleeve 410 is arranged in the massage output hole 203, the piston rod 420 is slidably installed in the sliding sleeve 410, the eccentric wheel 440 is arranged on the output end of the motor 310, one end of the transmission arm 430 is hinged with the tail end of the piston rod 420, and the other end thereof is hinged with the eccentric shaft of the eccentric wheel 440; and when the steering head 200 rotates to any angle, the transmission arm 430 does not interfere with the connecting rod 321. Because the transmission arm 430 needs to occupy a swing space during the working process and during the rotation following the steering head 200, the connecting rod 321 is not provided at the position of the motor bracket 320 corresponding to the swing space of the transmission arm 430. For example, when the axis of the steering head front mouth 230 at an extreme position at one end of the escape chute 114 is taken as the reference axis, the swing space range of the transmission arm 430 is 0°-150°, so the connecting rod 321 and the wall 322 are not provided in the corresponding range of 0°-150° on the motor bracket 320, so as to ensure that the transmission arm 430 will not interfere with the connecting rod 321 when the steering head 200 rotates to any angle. The eccentric wheel 440 is usually located in the center of space surrounded by a plurality of the connecting rods 321 and the walls 322, and its rotation will not interfere with the connecting rods 321 and the walls 322.

In order to reduce vibration and noise transmitted to the fascia gun housing 110 during the reciprocating motion of the piston rod 420, as shown in FIG. 5, the sliding sleeve 410 is nested in the massage output hole 203 through the damping sleeve 204. The damping sleeve 204 can generally be made of elastic or flexible materials, preferably rubber or silica gel.

Specifically, as shown in FIG. 2 and FIG. 4, the multi-handle fascia gun further includes a control assembly, where the control assembly includes a main control board 510 and a battery 520 both which are arranged in the fascia gun housing 110, and the motor 310 and the battery 520 are electrically connected with the main control board 510 respectively. The main control board 510 is mainly used to control working state of the fascia gun, and the battery 520 is mainly used for power supply. Generally, a polymer physical battery is selected as the battery 520.

Specifically, as shown in FIG. 1 and FIG. 4, the first handle 121 and the third handle 123 are both provided with the battery 520, and the main control board 510 is arranged in the second handle 122. This arrangement can further improve coincidence between the center of gravity of the whole fascia gun and the axis of impact force when the steering head 200 rotates to various angles, delivering better use effect. In particular, the battery 520 itself has a large weight. After the battery 520 is separately installed, the position of the center of gravity of the fascia gun is adjusted accordingly, so that the center of gravity axis adjusted according to the holding handle and the axial direction of the impact force can have a high coincidence or a small included angle with the axis of the impact force, and the gravity effect of the fascia gun can be superimposed on the axial direction of the impact force, so that the force can be increased when the impact force is output, and vibration generated during the reset movement can be offset by gravity in part, reducing vibration of the holding part.

Preferably, the motor housing of the rotary fitting part 220 is provided with a motor outlet slot 206, the motor 310 is electrically connected with the main control board 510 through a motor power cord, and when the motor power cord passes through the motor outlet slot 206 and the steering head 200 rotates to any angle, the motor power cord does not interfere with the motor housing. The motor outlet slot 206 is usually a strip slot, and is opened along the rotation direction of the rotary fitting part 220. Because the motor 310 will not rotate with the steering head 200, and the length of the motor outlet slot 206 meets the following requirements: when the steering head 200 rotates to any angle, the motor power cord will not interfere with the motor housing; therefore, the motor power cord will neither rotate with the steering head 200, nor will it rub against the motor housing, which can avoid problems such as fracture of the motor power cord or its skin breakage and short circuit.

To facilitate charging the battery 520, as shown in FIG. 1 and FIG. 4, the control assembly further includes a charging interface 530 arranged on the fascia gun housing 110, and the charging interface 530 is electrically connected with the main control board 510. The charging interface 530 can be various, such as a USB interface, preferably a USB Type-C interface.

In order to conveniently display the working state of the fascia gun, as further shown in FIG. 1 and FIG. 4, the control assembly further includes a display screen 540 arranged on the fascia gun housing 110, and the display screen 540 is electrically connected with the main control board 510.

Specifically, as shown in FIG. 4, the control assembly further includes a power switch 550 and a power button 560, where the power switch 550 is arranged on the fascia gun housing 110 and electrically connected with the main control board 510, and the power button 560 is arranged on the fascia gun housing 110 and corresponds to the power switch 550. The power switch 550 is mainly used to control opening and closing of the fascia gun, and the power switch 560 is mainly used to trigger the power switch 550.

As a preferred scheme of the invention, as shown in FIG. 1, FIG. 2, FIG. 4 and FIGS. 6-14, the multi-handle fascia gun further includes a steering head locking assembly, where the steering head locking assembly includes clamping holes 610, a movable bracket 620, an elastic piece 630, and an unlock key 640; the clamping holes 610 are arranged in the outer edge of the rotary fitting part 220, and clamping holes 610 are provided in at least two and distributed at intervals along the rotating direction of the rotary fitting part 220; the movable bracket 620 is movably installed in the fascia gun body 100, and a rotation stop part 621 is arranged on the movable bracket 620 and capable of being inserted into at least two clamping holes 610; the elastic piece 630 is arranged in the fascia gun body 100, and capable of driving the movable bracket 620 to move in the direction close to the rotary fitting part 220, so that the rotation stop part 621 is capable of being inserted into the clamping hole 610 corresponding to the rotation stop part 621; and the unlock key 640 is movably installed on the fascia gun body 100 and capable of moving towards the inside of the fascia gun body 100 under the pressing action of external force, so that the movable bracket 620 moves away from the rotary fitting part 220, and the rotation stop part 621 is detached from the corresponding clamping hole 610.

When the steering head locking assembly is in use, the unlock key 640 is pressed and moves towards the inside of the fascia gun body 100 under the pressing action of external force, and drives the rotation stop part 621 to move away from the rotary fitting part 220, so as to escape from the corresponding clamping hole 610, thereby realizing unlocking. The whole use process is convenient to operate and has a good locking effect.

The clamping hole 610 is mainly used to clamp the movable bracket 620 to lock and fix the steering head 200. The number of clamping holes 610 and the corresponding central angle can be flexibly selected according to a set rotation gear, so as to adjust the steering head 200 to more and more accurate angles and massage different parts of a body conveniently. The number of clamping holes 610 is preferably six, and the included angle between the axes of two adjacent clamping holes 610 is usually 18°-30°. For example, when the vertical axis of the fascia gun body 100 is taken as the reference axis 2, the angle between the steering head front mouth 230 and the reference line 2 is 80° when the steering head front mouth 230 is in a lower limit position and 188° when it is in an upper limit position, that is, the steering head front mouth 230 can be rotated and adjusted within the range of 80°-188° relative to the reference line 2.

The movable bracket 620 is a locking and clamping part, and its rotation stop part 621 is mainly used to be inserted into the clamping hole 610 to lock and fix the steering head 200. The movable bracket 620 can be movably installed in the fascia gun body 100 in various ways, such as slidable installation and swingable installation. The structure of the rotation stop part 621 can be various, for example, rectangular, cylindrical, and conical. When it is necessary to guide the rotation stop part 621 by using the clamping hole 610, the side surface of the rotation stop part 621 corresponding to the rotation direction of the rotary fitting part 220 can usually be set as a guide surface with an inclined or arc structure.

The elastic piece is one of the main components of the steering head locking assembly. It can use its own elastic force to drive the unlock key 640 to reset and drive the rotation stop part 621 to move towards the rotary fitting part 220. It can also insert the rotation stop part 621 into the clamping hole 610 corresponding to the rotation stop part 621 to achieve locking function. There are many kinds of elastic piece, such as springs, rubber bands, disc springs, and torsion springs.

The unlock key 640 is a manual button of the steering head locking assembly and is mainly used to manually control and unlock the steering head 200. The unlocking key 640 can be movably installed on the fascia gun body 100 in various ways, such as sliding fit and rotatable installation.

According to the required functions of the locking assembly, the invention provides the following three specific structural forms:

Embodiment 1

Figure 6:
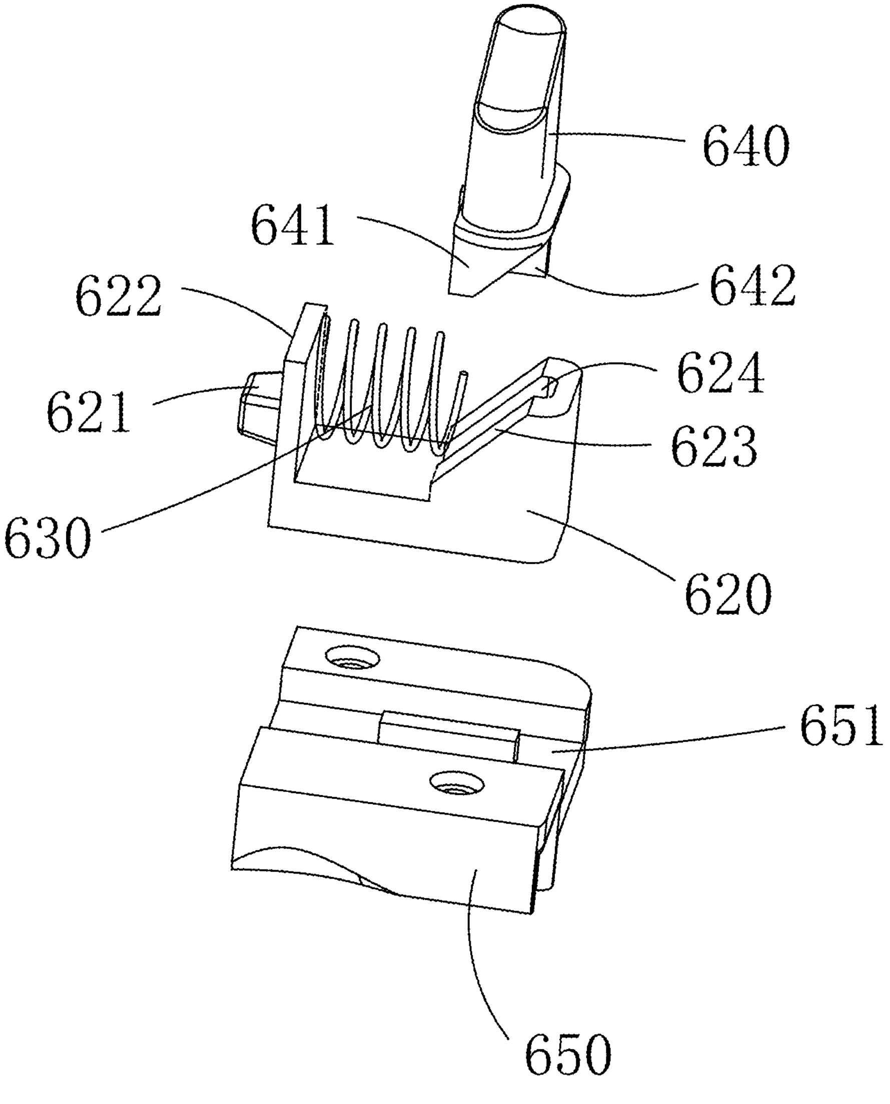
FIG. 6 is a three-dimensional exploded drawing of the steering head locking assembly according to the first embodiment of the invention.
Figure 7:
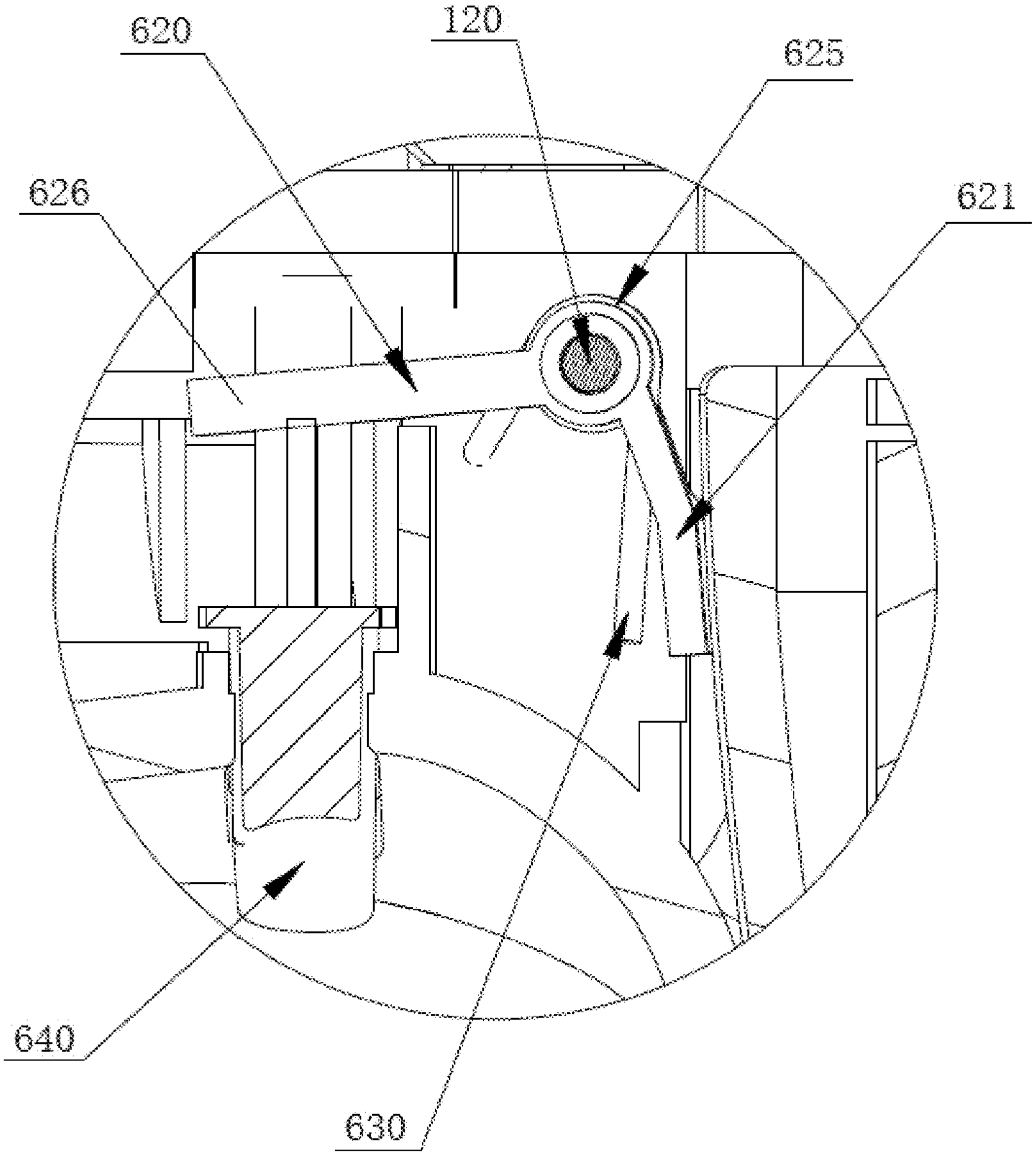
FIG. 7 is a schematic diagram of the locking state of the steering head locking assembly according to the second embodiment of the invention.
Figure 8:
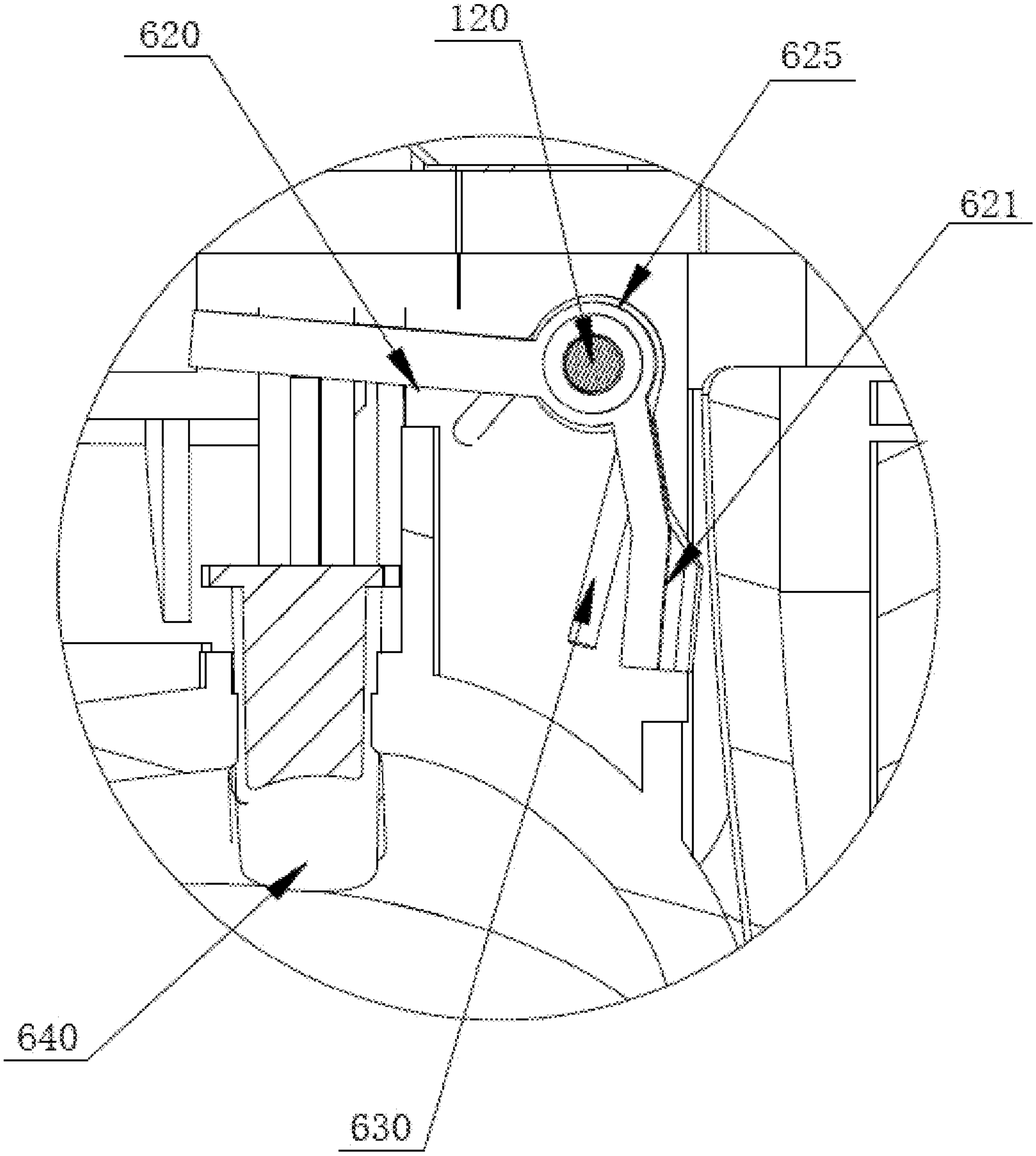
FIG. 8 is a schematic diagram of the unlocking state of the steering head locking assembly according to the second embodiment of the invention.
Figure 9:
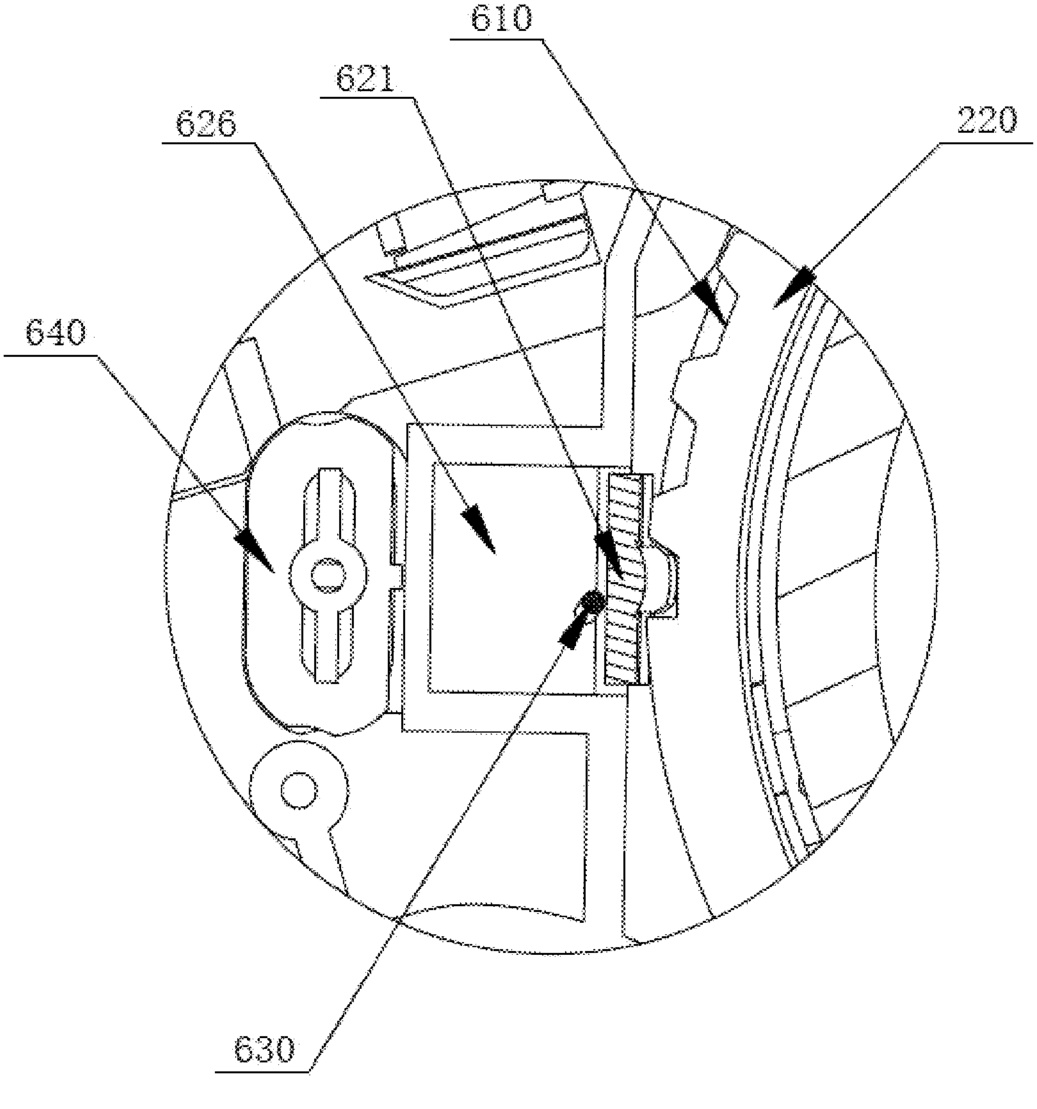
FIG. 9 is a schematic sectional view of the bottom view of FIG. 7.
Figure 10:
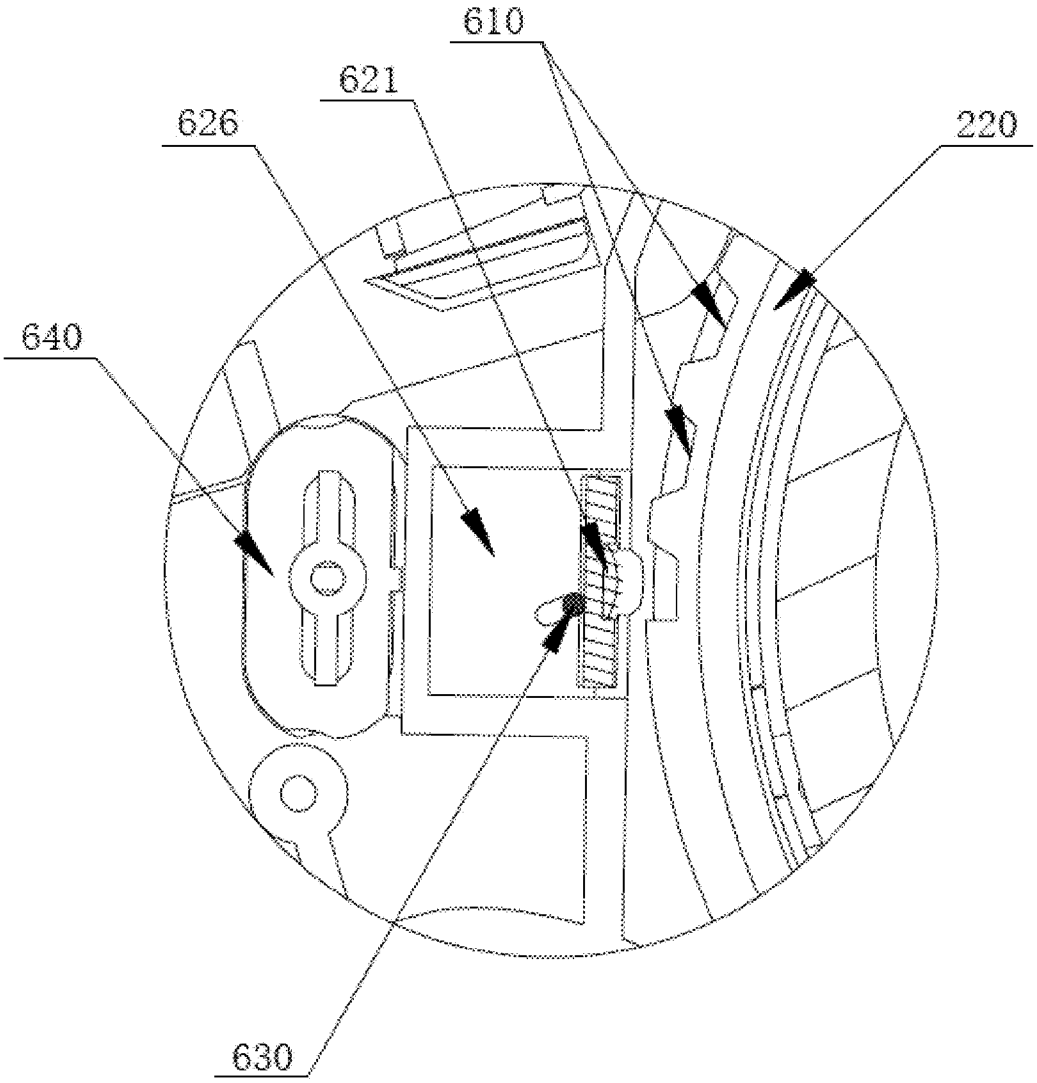
FIG. 10 is a schematic sectional of the bottom view of FIG. 8.
Figure 11:
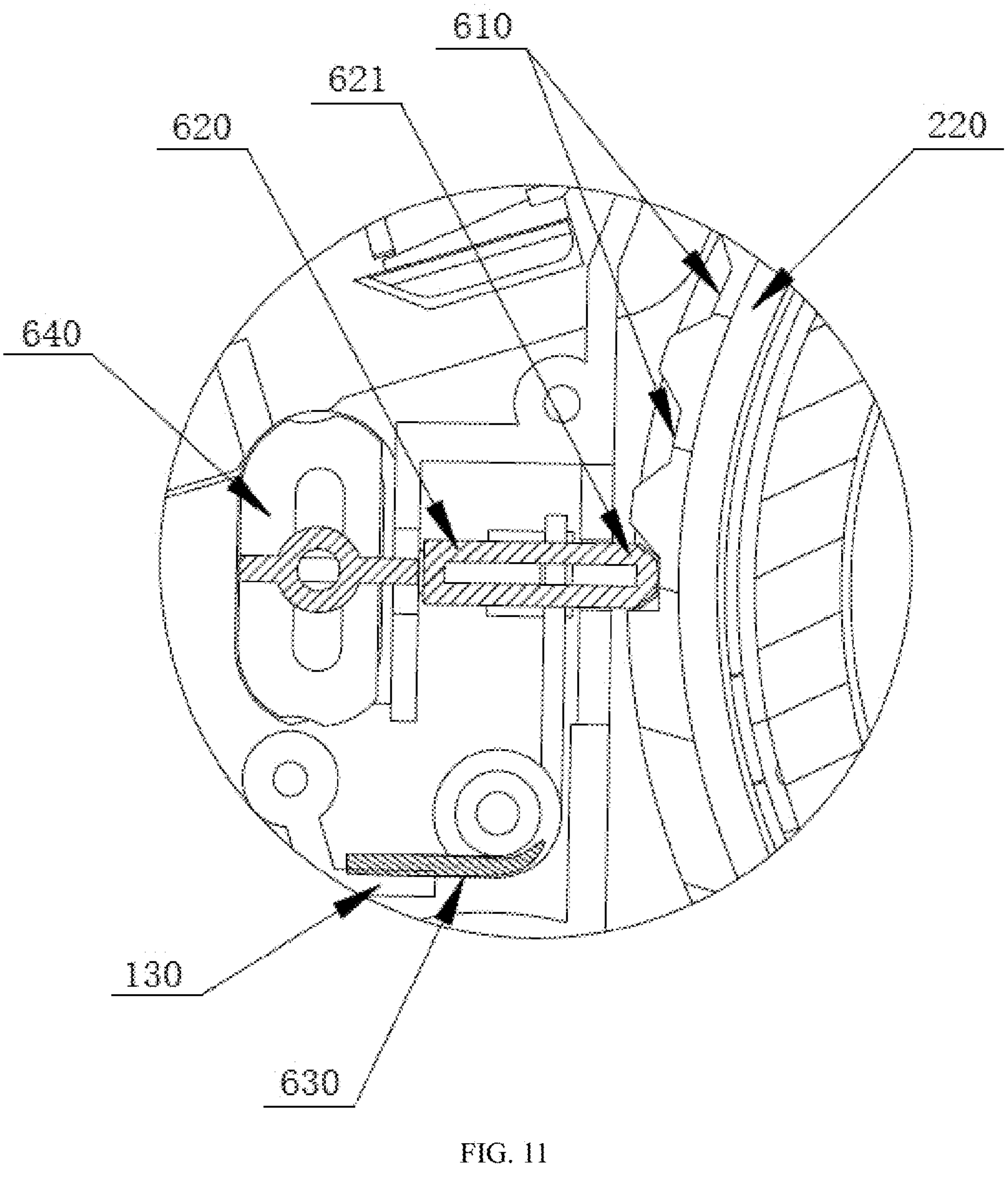
FIG. 11 is a schematic diagram of the locking state of the steering head locking assembly according to the third embodiment of the invention.
Figure 12:
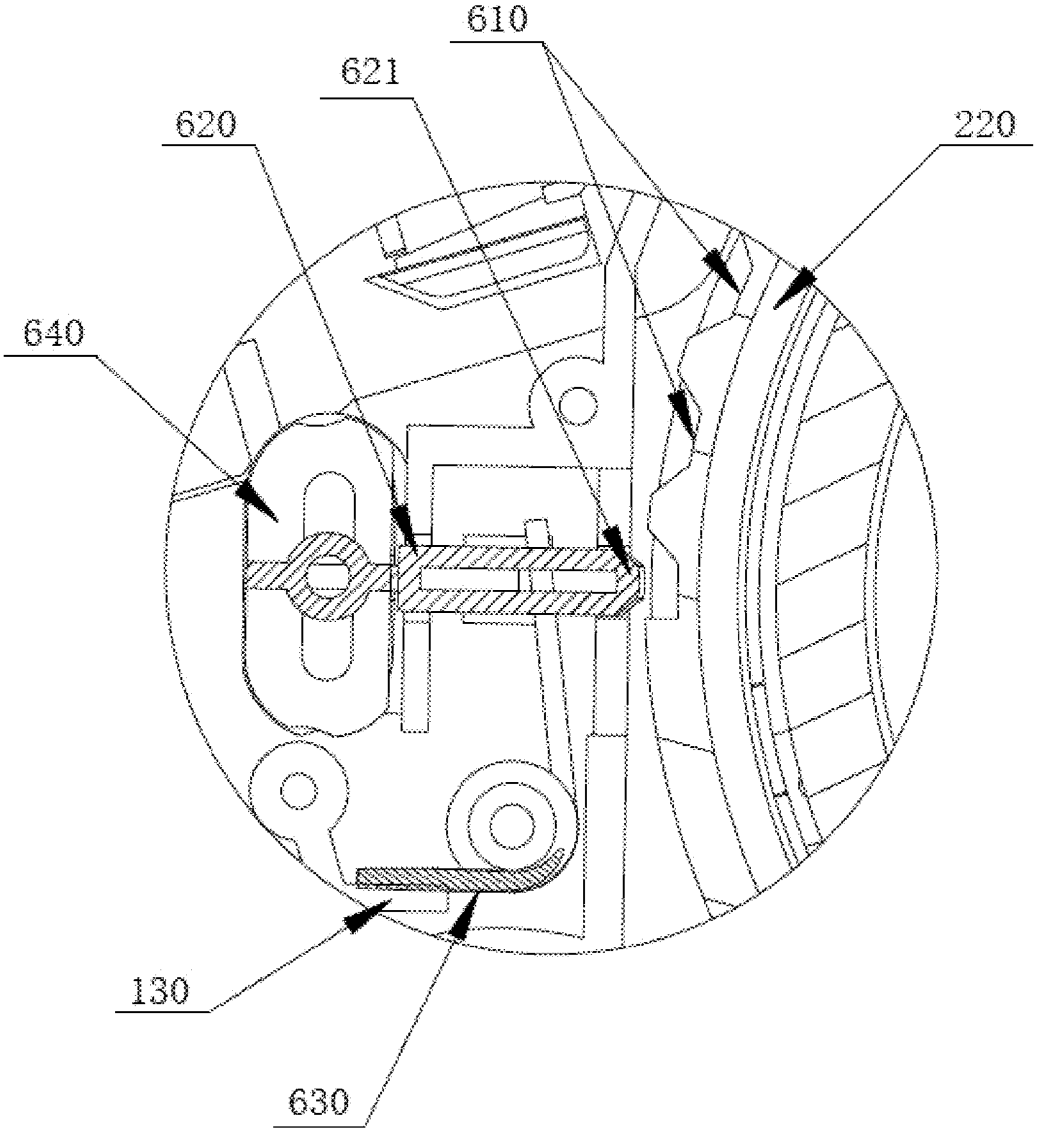
FIG. 12 is a schematic diagram of the unlocking state of the steering head locking assembly according to the third embodiment of the invention.
Figure 13:
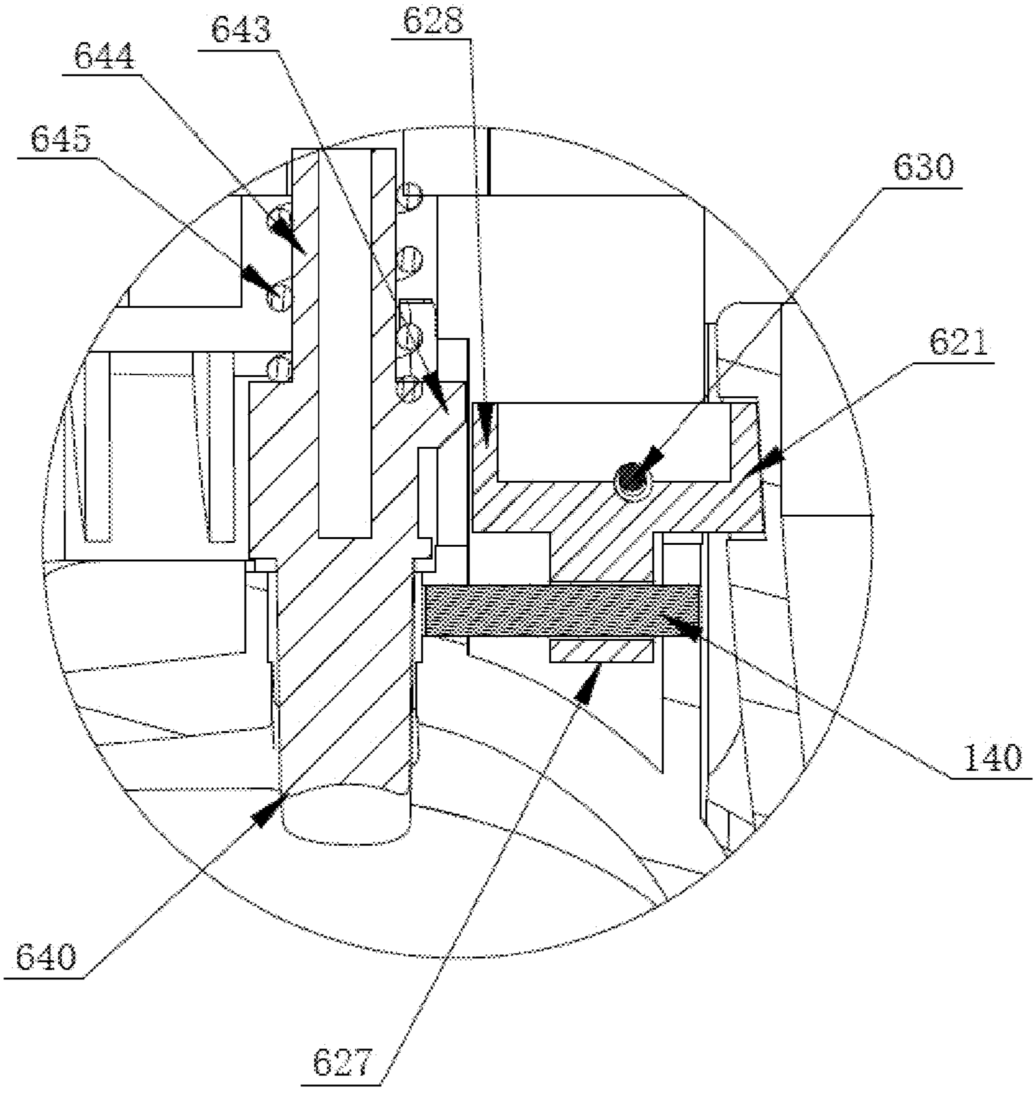
FIG. 13 is a schematic sectional view of the bottom view of FIG. 11.
Figure 14:
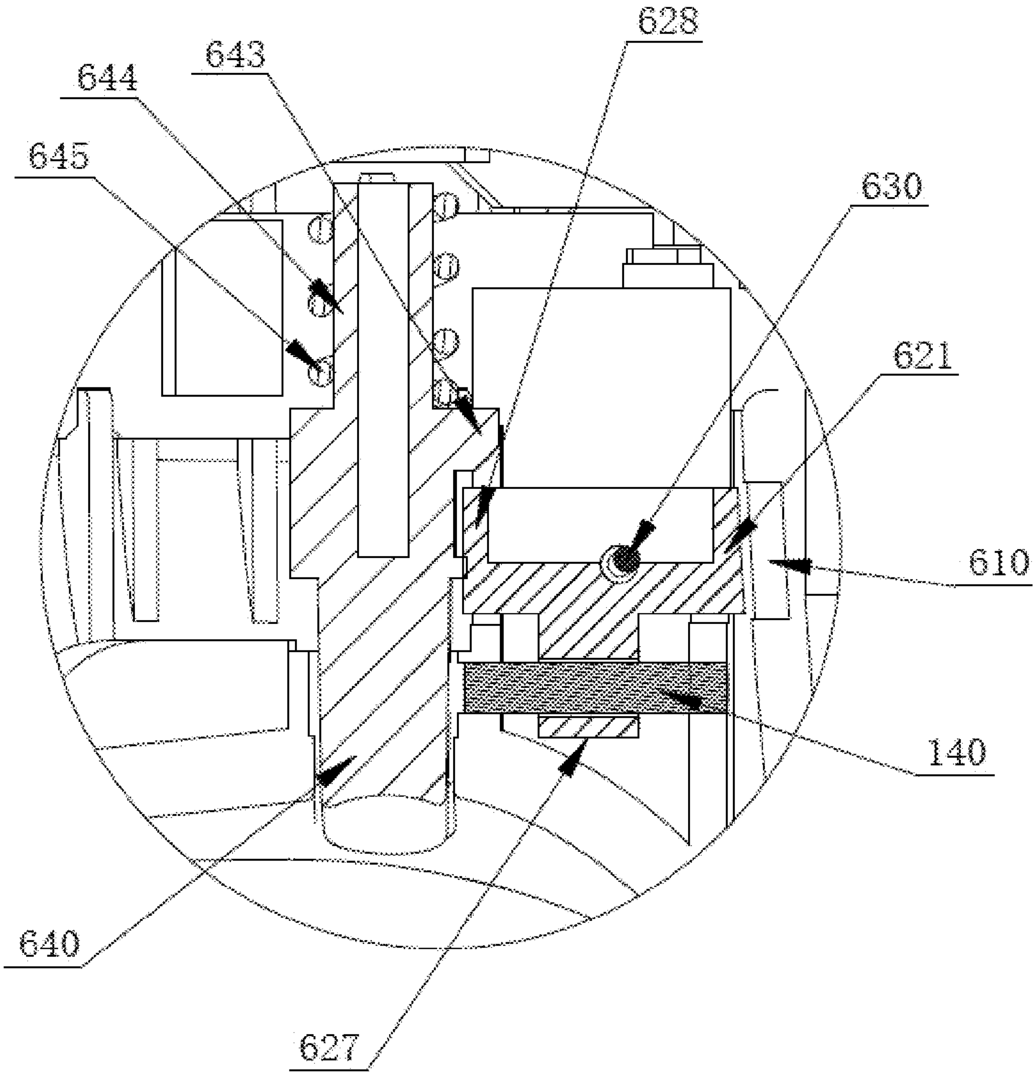
FIG. 14 is a schematic sectional view of the bottom view of FIG. 12.

As shown in FIG. 6, the movable bracket 620 is provided with a baffle 622 and a guide block at intervals, the side of the guide block close to the baffle 622 is a inclined guide surface 623, and the rotation stop part 621 is arranged on the outer side of the baffle 622; the elastic piece 630 is a spring arranged on the inner side of the baffle 622, and the free end of the spring corresponds to the inclined guide surface 623; and the lower end of the unlock key 640 is a guide part 641, and the guide part 641 corresponds to the position between the spring and the inclined guide surface 623. The spring can push the unlocking key 640 to form and maintain a wedge-shaped fit with the movable bracket 620. Because the movable bracket 620 is movably installed, when the unlocking key 640 is pressed down, the movable bracket 620 is driven to move away from the rotary fitting part 220 through the wedge-shaped fit function, and at this time, the guide part 641 will press the spring to make it in a pre-tightening state. After the pressing force is released, the unlocking key 640 will be pushed to move upward and reset under the elastic force of the spring, and the movable bracket 620 will be pushed to move in the direction close to the rotary fitting part 220, so that the rotation stop part 621 will be inserted into the corresponding clamping hole 610.

Based on the above, in order to facilitate guidance, the guide part 641 is wedge-shaped and has an inclined plane corresponding to the guide inclined surface 623 with same inclination.

In order to ensure accurate alignment and ensure the effectiveness of unlocking, as further shown in FIG. 6, the guide inclined surface 623 is provided with a positioning groove 624, and the guide part 641 is provided with a positioning block 642 adapted to the positioning groove 624.

Specifically, the steering head locking assembly further includes a fixed bracket 650 arranged in the fascia gun body 100, a bracket guide groove 651 is formed in the fixed bracket 650, and the movable bracket 620 is slidably arranged in the bracket guide groove 651. Slidably installing the movable bracket 620 on the fixed bracket 650 is not only beneficial to guide the movable bracket 620, but also ensures the effectiveness of unlocking the steering head 200.

Embodiment 2

As shown from FIG. 7 to FIG. 10, the movable bracket 620 is rotatably installed in the fascia gun body 100 through a rotating shaft 120, and the movable bracket 620 includes a rotating part 625 sleeved on the rotating shaft 120, and a rotation stop part 621 and a pressing end 626 both which are arranged on the rotating part 625; the inner end of the unlock key 640 corresponds to the pressing end 626; when moving towards the inside of the fascia gun body 100, the unlock key 640 is capable of pushing the pressing end 626 to drive the movable bracket 620 to rotate, and driving the rotation stop part 621 to detach from the clamping hole 610 into which the rotation stop part 621 is inserted; and when no external force is applied to the unlock key 640, the rotation stop part 621 is capable of being pushed under the elastic force of the elastic piece 630 so as to drive the rotation of the movable bracket 620, and then the unlock key 640 is pushed back by the pressing end 626 for resetting.

The movable bracket 620 of the locking mechanism is arranged in a form of a lever, and the rotation stop part 621 of the movable bracket 620 is inserted into one of the clamping holes 610 by the elastic force of the elastic piece 630, so that the steering head 200 is locked at an angle. The unlock key 640 controls the rotation stop part 621 of the movable bracket 620 to be far away from or close to the rotary fitting part 220 of the steering head 200. When the unlock key 640 is pressed, the movable bracket 620 rotates around the rotating shaft 120, which can drive the rotation stop part 621 to detach from the clamping hole 610 into which the rotation stop part 621 is inserted. At this time, the steering head 200 can be rotated to adjust the angle. When a user adjusts the steering head 200 to a required angle, release the unlock key 640, the elastic piece 630 will push the rotation stop part 621 and drive the movable bracket 620 to rotate, and then the pressing end 626 will push the unlock key 640 back to reset it. The locking strength of the locking mechanism is determined by the elastic force of the elastic piece 630, which has the advantages of simple structure, effective transmission, convenient operation and the like.

Based on the above, in order to further simplify the structure and reduce the cost, the elastic piece 630 is a torsion spring; with the elastic piece 630 being in a pre-tightening state, one torsion leg of the elastic piece is abutted against the limiting structure inside the fascia gun body 100, and the other torsion leg thereof is abutted against the rotation stop part 621. The limiting structure can be a baffle or a side wall, and can also be a retaining groove or a slot.

Specifically, an included angle between the rotation stop part 621 and the pressing end 626 is an obtuse angle, and the side of the rotation stop part 621 away from the pressing end 626 is the outer side thereof; the elastic piece 630 is sleeved on the rotating shaft 120, and the torsion leg of the elastic piece 630 near the rotation stop part 621 passes through the rotation stop part 621 along the outer side of the rotation stop part 621. The movable bracket 620 with this structure has a good force transmission function and a long distance, which is beneficial to control with the unlock key 640, and has a simple structure, delivering better locking effect.

Embodiment 3

As shown from FIGS. 11-14, the movable bracket 620 is slidably installed in the fascia gun body 100 through a slide rail 140, and the movable bracket 620 includes a sliding part 627 slidably fitting with the slide rail 140, and a rotation stop part 621 and a key stop end 628 both which are arranged on the sliding part 627; the rotation stop part 621 is a lug with a trapezoidal longitudinal section, and the clamping hole 610 is a trapezoidal groove matching with the rotation stop part 621; the unlock key 640 is provided with a guide section 643; when no external force is applied to the unlock key 640, the guide section 643 is abutted against the key stop end 628; and when external force is applied to the unlock key 640, the guide section 643 and the key stop end 628 are staggered, so that the rotation stop part 621 is detachable from the clamping hole 610 in which the rotation stop part 621 is inserted under the external force.

The movable bracket 620 of the locking mechanism is arranged in a form of a sliding bar, and the rotation stop part 621 of the movable bracket 620 is inserted into one of the clamping holes 610 by the elastic force of the elastic piece 630, so as to lock the steering head 200 at an angle. Under normal conditions, the guide section 643 of the unlock key 640 is abutted against the key stop end 628 of the movable bracket 620, so that the movable bracket 620 cannot slide, thereby locking the steering head 200 at a required angle. When the unlock key 640 is pressed, it moves and drives the guide section 643 to give way, so that the position of the guide section 643 and the key stop end 628 is staggered, making room for the movable bracket 620 to slide. When the steering head 200 is rotated by external force, the rotation stop part 621 can overcome the elastic force of the elastic piece 630 and passively come out of the clamping hole 610 under the cooperation of the trapezoidal convex block and the inclined plane of the trapezoidal groove, and then the steering head 200 can be rotated to adjust the angle. When adjusting the steering head 200 to a required angular position, a user releases the unlock key 640 to reset it and the guide section 643 is abutted against the key stop end 628, thereby realizing the locking function. The locking mechanism can realize the locking function by occupying the sliding position of the movable bracket 620 by the guide section 643 of the unlock key 640, and has the advantages of simple structure, good locking effect and the like.

Based on the above, in order to further simplify the structure and reduce the cost, the elastic piece 630 is a torsion spring, and the fascia gun body 100 is internally provided with a torsion spring limiting structure 130; with the elastic piece 630 being in a pre-tightening state, one torsion leg of the elastic piece is abutted against the torsion spring limiting structure 130, and the other torsion leg thereof passes through the rotation stop part 621. The torsion spring limiting structure 130 can be a baffle or a side wall, and can also be a retaining groove or a slot.

To facilitate reset of the unlock key 640, the fascia gun body 100 is internally provided with a key limiting structure in which a key through hole is formed, the unlock key 640 is slidably installed in the key through hole, a spring column 644 is arranged at the position of the unlock key 640 in the control handle 124 and sleeved with a button reset spring 645, and both ends of the button reset spring 645 are each abutted against the key limiting structure and the unlock key 640. In order to ensure that the unlock key 640 does not fall off from the key through hole, a corresponding limiting structure can be arranged between the unlock key 640 and the key through hole, or both ends of the button reset spring 645 can be directly and fixedly connected with the unlock key 640 and the key limiting structure, and the unlock key 640 can be prevented from falling off by using the button reset spring 645. In a natural state, the unlock key 640 is exposed under the action of the button reset spring 645. When the unlock key 640 is pressed, it moves into the key through hole against the elastic force of the button reset spring 645, and after being released, the unlock key 640 is reset under the action of the button reset spring 645.

What is claimed is:

1. A multi-handle fascia gun, comprising: a fascia gun body and a steering head, wherein the fascia gun body comprises a fascia gun housing with a steering head housing, a head portion of the steering head is a steering head front mouth, and a tail portion thereof is a rotary fitting part rotatably mounted in the steering head housing; the fascia gun housing further comprises a first handle, a third handle, a second handle, and a control handle connected in sequence; the axes of the first handle, the third handle, the second handle, and the control handle enclose a parallelogram;

the steering head housing is disposed at a position where the first handle intersects with the control handle;

a joint of the first handle and the third handle, a joint of the second handle and the third handle, and a joint of the second handle and the control handle are all in smooth transition connection;

a steering head locking assembly, wherein the steering head locking assembly comprises clamping holes, a movable bracket, an elastic piece, and an unlock key, and wherein:

the clamping holes are arranged in an outer edge of the rotary fitting part, and at least two clamping holes are provided and distributed at intervals along the rotating direction of the rotary fitting part;

the movable bracket is movably installed in the control handle, and a rotation stop part is arranged on the movable bracket and capable of being inserted into the clamping hole;

the elastic piece is arranged in the control handle, and capable of driving the movable bracket to move in a direction close to the rotary fitting part, so that the rotation stop part is capable of being inserted into a clamping hole corresponding to the rotation stop part; and the unlock key is movably installed on the control handle and capable of moving towards the inside of the control handle under the pressing action of external force, so that the movable bracket moves away from the rotary fitting part, and the rotation stop part is detached from the corresponding clamping hole; and wherein the movable bracket is provided with a baffle and a guide block at intervals, a side of the guide block close to the baffle is an inclined guide surface, and the rotation stop part is arranged on an outer side of the baffle; the elastic piece is a spring arranged on an inner side of the baffle, and a free end of the spring corresponds to the inclined guide surface; and a lower end of the unlock key is a guide part, and the guide part corresponds to a position between the spring and the inclined guide surface.

2. The multi-handle fascia gun according to claim 1, wherein an included angle between the axis of the second handle and the axis of the third handle is 30°-80°.

3. The multi-handle fascia gun according to claim 1, wherein the fascia gun housing comprises a first fascia gun housing, a second fascia gun housing, a first finishing component, and a second finishing component; the first fascia gun housing and the second fascia gun housing are coordinately connected with each other; and front edges of the first fascia gun housing and the second fascia gun housing enclose a front gap, and rear edges thereof enclose a rear gap, wherein the first finishing component is installed at the front gap, and the second finishing component is installed at the rear gap.

4. The multi-handle fascia gun according to claim 1, wherein the rotary fitting part comprises a motor housing, an escape chute is formed in the steering head housing, the motor housing is rotatably installed in the steering head housing, and the steering head front mouth passes through the escape chute and moves along the escape chute.

5. The multi-handle fascia gun according to claim 4, wherein two ends of the motor housing are each provided with an escape hole, which is a round hole, and a frustum, each frustum being rotatably match ed with its respective escape hole, each of said frustums being arranged in the steering head housing.

6. The multi-handle fascia gun according to claim 5, wherein the steering head housing is provided with a heat dissipation structure corresponding to the escape hole.

7. The multi-handle fascia gun according to claim 6, wherein the heat dissipation structure comprises at least two heat dissipation holes distributed in an annular array.

8. The multi-handle fascia gun according to claim 5, wherein the two ends of the motor housing are each provided with a soft rubber ring, and an inner hole of the soft rubber ring is a part of an axial hole section of each escape hole.

9. The multi-handle fascia gun according to claim 4, wherein when the axis of the steering head front mouth at the extreme position at one end of the escape chute is taken as a reference axis, the length of the escape chute meets the requirement that an included angle between the axis of the steering head front mouth and the reference axis is adjustable within the range of 0°-150°.

10. The multi-handle fascia gun according to claim 4, wherein the steering head housing comprises a first steering head housing and a second steering head housing which are coordinately connected.

11. The multi-handle fascia gun according to claim 4, further comprising a motor assembly, wherein the motor assembly comprises a motor and a motor bracket, the motor housing is internally provided with an assembly accommodating chamber, and a side wall of the assembly accommodating chamber is provided with an escape hole; the motor bracket is suspended in the assembly accommodating chamber and connected with the fascia gun housing by a connecting structure passing through the escape hole; and the motor is suspended in the assembly accommodating chamber and connected with the motor bracket.

12. The multi-handle fascia gun according to claim 11, wherein one of the connecting structure comprises a connecting rod arranged on the motor bracket, and a connecting end of the connecting rod passes through the assembly accommodating chamber from the escape hole and is connected with the fascia gun housing; and the connecting structure comprises a motor connecting part arranged on the fascia gun housing which penetrates into the assembly accommodating chamber from the escape hole and is connected with the motor bracket; and the connecting structure comprises a connecting rod arranged on the motor bracket and a motor connecting part arranged on the fascia gun housing, wherein the motor connecting part penetrates into the assembly accommodating chamber from the escape hole, and the connecting end of a connecting rod is connected with the motor connecting part.

13. The multi-handle fascia gun according to claim 12, wherein there are at least two connecting rods, and a wall is arranged between any two adjacent connecting rods.

14. The multi-handle fascia gun according to claim 13, wherein the connecting end of a connecting rod is provided with a pillow block, and the pillow block is sleeved with an anti-vibration sleeve abutting against the fascia gun housing.

15. The multi-handle fascia gun according to claim 11, further comprising a driving assembly, wherein the driving assembly comprises a sliding sleeve, a piston rod, a transmission arm, and an eccentric wheel; the steering head is internally provided with a massage output hole; the sliding sleeve is arranged in the massage output hole, the piston rod is slidably installed in the sliding sleeve, the eccentric wheel is arranged on the output end of the motor, one end of the transmission arm is hinged with the tail end of the piston rod, and the other end thereof is hinged with the eccentric shaft of the eccentric wheel.

16. The multi-handle fascia gun according to claim 15, wherein the sliding sleeve is nested in the massage output hole through a vibration damping sleeve.

17. The multi-handle fascia gun according to claim 11, further comprising a control assembly, wherein the control assembly comprises a main control board and a battery both which are arranged in the fascia gun housing, and the motor and the battery are electrically connected with the main control board respectively.

18. The multi-handle fascia gun according to claim 17, wherein the first handle and the third handle are both provided with the battery, and the main control board is arranged in the second handle.

19. The multi-handle fascia gun according to claim 17, wherein the motor housing of the rotary fitting part is provided with a motor outlet slot, the motor is electrically connected with the main control board through a motor power cord, and when the motor power cord passes through the motor outlet slot and the steering head rotates to any angle, the motor power cord does not interfere with the motor housing.

20. The multi-handle fascia gun according to claim 17, wherein the control assembly further comprises a charging interface arranged on the third handle, and the charging interface is electrically connected with the main control board.

21. The multi-handle fascia gun according to claim 17, wherein the control assembly further comprises a display screen arranged on the control handle, and the display screen is electrically connected with the main control board.

22. The multi-handle fascia gun according to claim 21, wherein the control assembly further comprises a power switch and a power button, wherein the power switch is arranged in the control handle and electrically connected with the main control board, and the power button is arranged on the control handle and corresponds to the power switch.

23. The multi-handle fascia gun according to claim 1, wherein the guide part is wedge-shaped and has an inclined plane corresponding to the inclined guide surface with same inclination.

24. The multi-handle fascia gun according to claim 1, wherein the inclined guide surface is provided with a positioning groove, and the guide part is provided with a positioning block adapted to the positioning groove.

25. The multi-handle fascia gun according to claim 1, wherein the steering head locking assembly further comprises a fixed bracket arranged in the control handle, a bracket guide groove is formed in the fixed bracket, and the movable bracket is slidably arranged in the bracket guide groove.

* * * * *